(12) United States Patent  
Matsubara

(10) Patent No.: US 10,115,656 B2  
(45) Date of Patent: Oct. 30, 2018

(54) SEMICONDUCTOR DEVICE

(71) Applicant: RENESAS ELECTRONICS CORPORATION, Tokyo (JP)

(72) Inventor: Yoshihisa Matsubara, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/798,971

(22) Filed: Oct. 31, 2017

(65) Prior Publication Data

US 2018/0061735 A1  Mar. 1, 2018

Related U.S. Application Data

(62) Division of application No. 15/374,478, filed on Dec. 9, 2016, now Pat. No. 9,837,335.

(30) Foreign Application Priority Data

Dec. 11, 2015  (JP) .................... 2015-242021

(51) Int. Cl.  
*H01L 23/29* (2006.01)  
*H01L 23/373* (2006.01)  
(Continued)

(52) U.S. Cl.  
CPC ........ *H01L 23/3733* (2013.01); *H01L 21/565* (2013.01); *H01L 23/295* (2013.01);  
(Continued)

(58) Field of Classification Search  
None  
See application file for complete search history.

(56) References Cited

U.S. PATENT DOCUMENTS 6,323,263 B1 * 11/2001 Kuwabawa ........ C08G 59/4215  
                                                                257/789  
7,799,607 B2 *  9/2010 Karashima .......... H01L 21/4853  
                                                                438/108  
(Continued)

FOREIGN PATENT DOCUMENTS

JP       11-284103 A     10/1999  
JP        5641484 B2     12/2014

OTHER PUBLICATIONS

Notice of Allowance issued in related U.S. Appl. No. 15/374,478, dated Aug. 28, 2017.  
(Continued)

*Primary Examiner* — Thien F Tran  
(74) *Attorney, Agent, or Firm* — McDermott Will & Emery LLP

(57) ABSTRACT

Performance of a semiconductor device is improved. Graphene particles are mixedly added in a sealing resin covering a semiconductor chip. The graphene particles are thus mixedly added in the sealing resin, thereby thermal conduction of the sealing resin is improved, and thus radiation performance of the semiconductor device can be improved. Graphene is a sheet of $sp^2$ bonded carbon atoms having a monolayer thickness. Graphene has a structure where hexagonal lattices, each of which is formed of carbon atoms and bonds of the carbon atoms, are planarly spread. Graphene is preferably used as heat transfer filler because of its high thermal conductivity and light weight.

3 Claims, 26 Drawing Sheets

(51) Int. Cl.
*H01L 21/56* (2006.01)
*H01L 23/31* (2006.01)
*H01L 23/00* (2006.01)
*H01L 23/433* (2006.01)

(52) U.S. Cl.
CPC .......... *H01L 23/3128* (2013.01); *H01L 24/29* (2013.01); *H01L 23/373* (2013.01); *H01L 23/4334* (2013.01); *H01L 24/11* (2013.01); *H01L 24/13* (2013.01); *H01L 24/16* (2013.01); *H01L 24/32* (2013.01); *H01L 24/45* (2013.01); *H01L 24/73* (2013.01); *H01L 24/83* (2013.01); *H01L 24/92* (2013.01); *H01L 2224/04042* (2013.01); *H01L 2224/1134* (2013.01); *H01L 2224/13144* (2013.01); *H01L 2224/16225* (2013.01); *H01L 2224/16227* (2013.01); *H01L 2224/2919* (2013.01); *H01L 2224/2929* (2013.01); *H01L 2224/29393* (2013.01); *H01L 2224/29499* (2013.01); *H01L 2224/32225* (2013.01); *H01L 2224/45124* (2013.01); *H01L 2224/45144* (2013.01); *H01L 2224/45147* (2013.01); *H01L 2224/45565* (2013.01); *H01L 2224/45686* (2013.01); *H01L 2224/45687* (2013.01); *H01L 2224/48091* (2013.01); *H01L 2224/48227* (2013.01); *H01L 2224/48247* (2013.01); *H01L 2224/48465* (2013.01); *H01L 2224/73204* (2013.01); *H01L 2224/73253* (2013.01); *H01L 2224/73265* (2013.01); *H01L 2224/81* (2013.01); *H01L 2224/83* (2013.01); *H01L 2224/83855* (2013.01); *H01L 2224/85* (2013.01); *H01L 2224/92125* (2013.01); *H01L 2224/92247* (2013.01); *H01L 2224/97* (2013.01); *H01L 2924/00012* (2013.01); *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 8,697,230 B2 | 4/2014 | Ago et al. | |
| 9,657,210 B1 | 5/2017 | Boday et al. | |
| 2014/0272385 A1 | 9/2014 | Dickinson et al. | |
| 2014/0377572 A1* | 12/2014 | Gaynes | B32B 9/00 428/448 |
| 2015/0073088 A1* | 3/2015 | Kim | C08J 5/005 524/605 |
| 2016/0090522 A1* | 3/2016 | Kim | C09K 5/14 428/480 |

OTHER PUBLICATIONS

Non-Final Office Action issued in related U.S. Appl. No. 15/374,478, dated Apr. 28, 2017.

\* cited by examiner $$1-\phi = \frac{\lambda c - \lambda f}{\lambda m - \lambda f}\left[\frac{\lambda m}{\lambda c}\right]^{1/3} \cdots (1)$$

φ : VOLUME FILLING RATE OF FILLER
λc : HEAT CONDUCTIVITY OF COMPOUND
λf : HEAT CONDUCTIVITY OF FILLER
λm : HEAT CONDUCTIVITY OF MATRIX

SEMICONDUCTOR DEVICE

CROSS-REFERENCE TO RELATED APPLICATIONS

This application is a Divisional of U.S. patent application Ser. No. 15/374,478, filed on Dec. 9, 2016, which claims benefit of Japanese Patent Application No. 2015-242021 filed on Dec. 11, 2015 including the specification, drawings and abstract are incorporated herein by reference in their entirety.

BACKGROUND

The present invention relates to a semiconductor device. For example, the invention is preferably used for a semiconductor device having a resin-molded semiconductor chip.

A semiconductor chip is coupled to an external terminal on a motherboard or the like, and is then resin-molded for protection. Such a resin coating prevents entering of water, and thus prevents properties of the semiconductor chip from being deteriorated.

However, when semiconductor elements integrated in the semiconductor chip are allowed to operate, each semiconductor element generates heat due to operating current or the like. Hence, the semiconductor device covered with resin is low in radiation, and is easily increased in temperature.

Japanese Unexamined Patent Application Publication No. Hei 11(1999)-284103 discloses a semiconductor device using a molding resin containing spherical aluminum-nitride insulator particles having the same diameter.

Japanese Patent No. 5641484 discloses the following method as a method of forming a graphene thin film. (1) Graphite such as HOPG is mechanically separated by a scotch-tape or the like to form a graphene thin film, (2) a graphene thin film is formed through thermal decomposition of SiC, and (3) a graphene thin film is formed through a carbonization reaction on a transition metal film by a chemical vapor deposition process. Japanese Patent No. 5641484 further discloses the following technique: A substrate including a single-crystal substrate, on which an epitaxial metal film is formed, is provided, and a carbon material is brought into contact with a surface of the epitaxial metal film, and thus a graphene thin film is grown.

SUMMARY

As described above, a countermeasure to temperature rise of a resin-sealed semiconductor chip is an important issue. In particular, a small device such as a mobile terminal is difficult to have a function of promoting radiation, such as a fan, and a radiation design is significantly important for the small device due to demands of smaller size and higher performance. For example, if operation frequency is increased to increase operation speed of CPU of a mobile terminal, effective current increases directly with the frequency, leading to an increase in calorific value.

Furthermore, radiation area decreases with a reduction in size of the semiconductor chip. For example, when a size of a semiconductor chip of 1 cm square is reduced into 1 mm square, radiation area is decreased to 1/100, i.e., radiation performance is decreased two orders in magnitude.

The countermeasure against temperature rise includes use of a highly thermal conductive resin. The highly thermal conductive resin typically includes a carbon resin containing aluminum, ceramics, or silicon added thereto, for example.

For example, when a metal block such as an aluminum block is added, leakage or weight increase may disadvantageously occur. Specifically, a short circuit may be induced, or dielectric strength voltage may be reduced. In particular, bad reception of an electric wave may occur in an RF device. When a graphene thin film is formed by a chemical vapor deposition process, formation temperature is near 1000° C. Hence, when the film is formed on a semiconductor device, thermal damage to a previously formed element is large.

It is therefore desired to provide a more effective measure to improve radiation performance of a resin-sealed semiconductor chip.

Other issues and novel features will be clarified from the description of this specification and the accompanying drawings.

Typical embodiments disclosed in this application are briefly summarized as follows.

A semiconductor device of one embodiment disclosed in this application includes a semiconductor chip, and a resin covering the semiconductor chip, the resin containing graphene particles.

A semiconductor device of one embodiment disclosed in this application includes a heatsink including a graphite material disposed in a two-dimensional direction.

A semiconductor device of one embodiment disclosed in this application includes a heatsink that includes a graphite material disposed in a two-dimensional direction and is disposed on a sidewall of a semi chip.

According to the semiconductor device of each typical embodiment disclosed in this application, radiation properties of the semiconductor device can be improved through disposition of a highly thermal conductive material or addition of a radiating surface.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step) of the embodiment is not necessarily indispensable except for the particularly defined case and for the case where the constitutional element is probably indispensable in principle. Similarly, in each of the following embodiments, when a shape of a constitutional element, a positional relationship, and the like are described, any configuration substantially closely related to or similar to such a shape or the like should be included except for the particularly defined case and for the case where the configuration is probably not included in principle. The same holds true in the number of elements and the like (including the number, a numerical value, amount, and a range).

Hereinafter, some embodiments of the invention will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a specific site. In the following embodiments, the same or similar portion is not repeatedly described in principle except for a particularly required case.

In drawings used in the embodiments, a sectional view may also not be hatched for better viewability.

In the sectional views and the plan views, size of each site does not correspond to an actual device, and a particular site may be illustrated to be relatively large for better viewability. When a sectional view corresponds to a plan view, a specific site may also be illustrated to be relatively large for better viewability.

First Embodiment

A semiconductor device of a first embodiment is now described in detail with reference to the accompanying drawings.

Description of Structure

Figure 1:
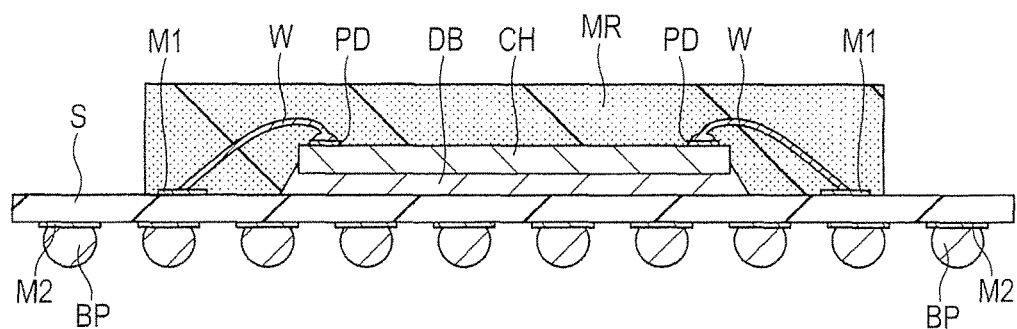
FIG. 1 is a sectional view illustrating a configuration of a semiconductor device of a first embodiment.
Figure 2:
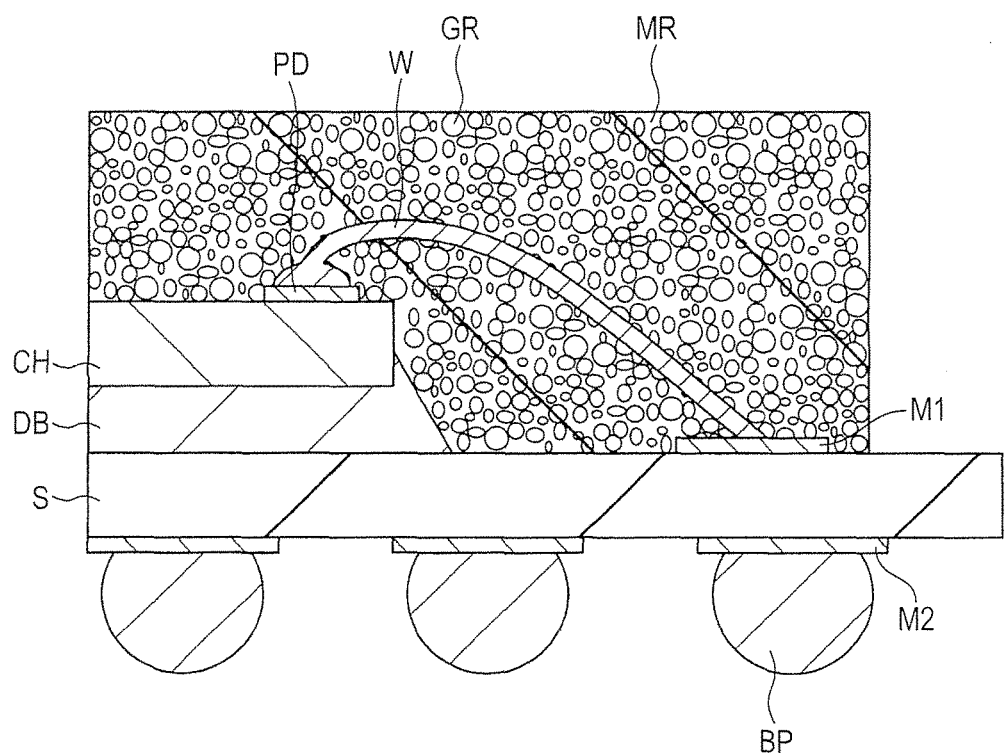
FIG. 2 is a sectional view illustrating the configuration of the semiconductor device of the first embodiment.

FIGS. 1 and 2 are each a sectional view illustrating a configuration of a semiconductor device of the first embodiment. FIG. 2 is a partial enlarged view of FIG. 1. The semiconductor device illustrated in FIG. 1 includes a semiconductor chip CH and a sealing resin (resin material) MR covering the semiconductor chip. The semiconductor chip CH is bonded onto a substrate (mounting board, interconnection substrate) S with a die-bonding material (for example, resin paste) DB. Pad regions PD are provided on a top of the semiconductor chip CH. For example, each pad region PD corresponds to a portion (an exposed region) of a top-layer interconnection provided in the semiconductor chip. Each pad region PD of the semiconductor chip CH is coupled to each conductive portion (a portion of an interconnection, a pad region) M1 provided on a surface of the substrate S via a bonding wire W. Bump electrodes BP are each provided on the back of the substrate S with a conductive portion (a portion of an interconnection, a pad region) M2 in between.

The sealing resin MR is provided so as to cover the semiconductor chip CH while containing graphene particles GR (FIG. 2). The graphene particles GR are thus mixedly contained in the sealing resin MR, thereby thermal conduction of the sealing resin MR is improved, leading to improvement in radiation performance.

A material for the sealing resin MR may include, but not limited to, thermosetting resin such as epoxy resin, phenol resin, and melamine resin, for example.

Figure 3:
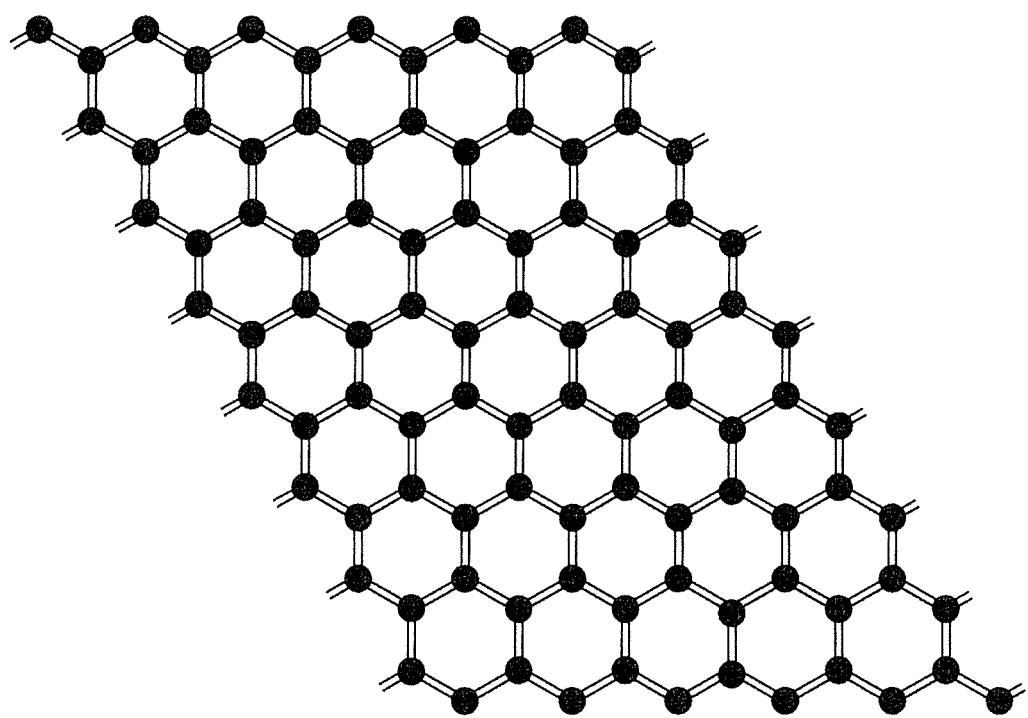
FIG. 3 illustrates a structure of graphene.

FIG. 3 illustrates a structure of graphene. Each black circle shows a carbon atom. Graphene is a sheet of $sp^2$ bonded carbon atoms having a monolayer thickness. Graphene has a structure where hexagonal lattices, each of which is formed of carbon atoms and bonds of the carbon atoms, are planarly spread. Graphene is on the market as "Graphene Powder", for example. Graphene is preferably used as heat transfer filler because of its high thermal conductivity and light weight.

In the first embodiment, particle size (average diameter) of the graphene particles GR to be mixedly added in the sealing resin MR may be adjusted to 10 to 500 µm. The particle size can be measured by cross-sectional SEM (scanning electron microscope), for example. The particles may include particles formed by granulating a monolayer or multilayer film of graphene. The particles may further include particles formed by compacting pulverized material (granular material, powdery material) of graphene with resin or the like. The added amount of the graphene particles GR in the sealing resin MR (the content in the sealing resin MR) may be about 50 vol %, for example. For example, the volume percent may be determined (calculated) with a conversion table of half-value width to peak intensity after X-ray measurement of actual samples having different volume ratios.

A larger size or a larger added-amount of the graphene particles GR leads to higher thermal conductivity. However, as described later, this concernedly leads to clogging of a nozzle for injecting a liquid resin during injection of the resin. However, if the particle size or the added amount is within the above-described range, such nozzle clogging is avoided and thus resin injection can be efficiently performed.

Short circuit between the bonding wires W may provably occur depending on the size or the added amount of the graphene particles GR. This can be controlled by mixedly adding a charged impurity such as potassium ion to graphene to reduce mobility of the graphene. In addition, the mobility can be reduced by breaking carbon bonds through plasma irradiation. The short circuit between the bonding wires W may be prevented by providing a coating agent on a surface of the bonding wire W. For example, the surface of the bonding wire W is coated with ceramics. The surface of the bonding wire W including a metal such as copper may be oxidized for insulating coating.

Description of Manufacturing Method

Figure 4:
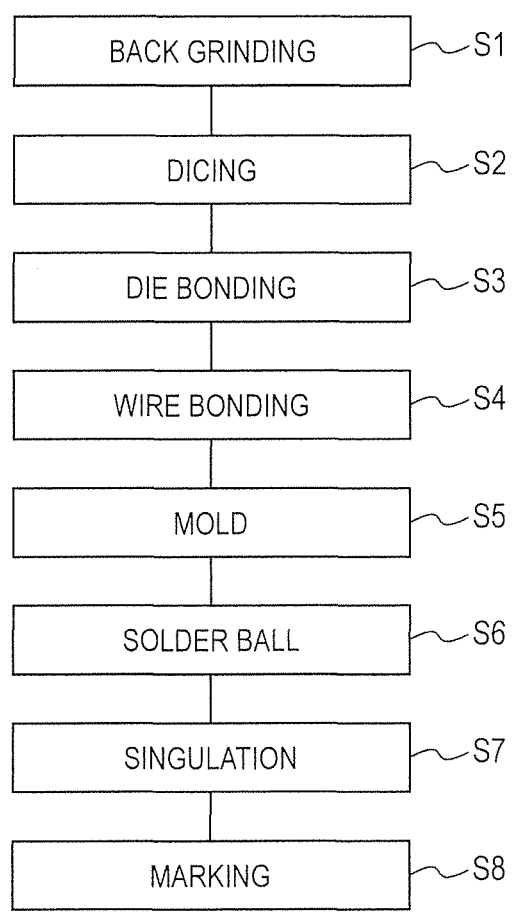
FIG. 4 is a flowchart of a manufacturing process of the semiconductor device of the first embodiment.

A manufacturing process of the semiconductor device of the first embodiment is now described while the structure of the semiconductor device is more clarified. FIG. 4 is a flowchart of the manufacturing process of the semiconductor device of the first embodiment. FIGS. 5 to 11 each illustrate the manufacturing process of the semiconductor device of the first embodiment.

As illustrated in FIG. 4, the manufacturing process of the semiconductor device of the first embodiment includes a back grinding step S1, a dicing step S2, a die bonding step S3, a wire bonding step S4, a molding step (resin sealing step) S5, a solder ball formation step S6, a singulation step S7, and a marking step S8.

The semiconductor chip illustrated in FIG. 1 is a cut product from a wafer. The wafer is a roughly circular sheet component including a semiconductor such as Si. Semiconductor elements such as MISFETs are formed on the main surface of the wafer, and are coupled via a plurality of interconnection layers. A protective film is provided on a top-layer interconnection, and a portion of the top-layer interconnection exposed from an opening of the protective film serves as the pad region PD. Although MISFET is shown as an example of the semiconductor element, another storage element such as DRAM or flash memory may be provided as the semiconductor element.

The back of the wafer is ground to reduce a thickness of the wafer (back grinding step S1) after the formation step (also called upstream process) of the semiconductor elements and interconnections. For example, a protective tape is attached onto the surface of the wafer, and the wafer is set at its surface side on a vacuum chuck table. The back side of the wafer is ground by a grindstone while the table is rotated. Subsequently, a UV tape for dicing is attached onto the back side, and the protective tape on the surface side is separated. For example, thickness of the wafer is adjusted to about 650 to about 100 µm.

Subsequently, the wafer is cut by individual chip regions (dicing step S2). The wafer is cut by a fast-rotated disc blade along a scribe line (dicing area) on the surface side of the wafer. At this time, the UV dicing tape on the back of the wafer is not cut, and a plurality of roughly rectangular semiconductor chips CH are being attached on the UV tape.

Figure 5:
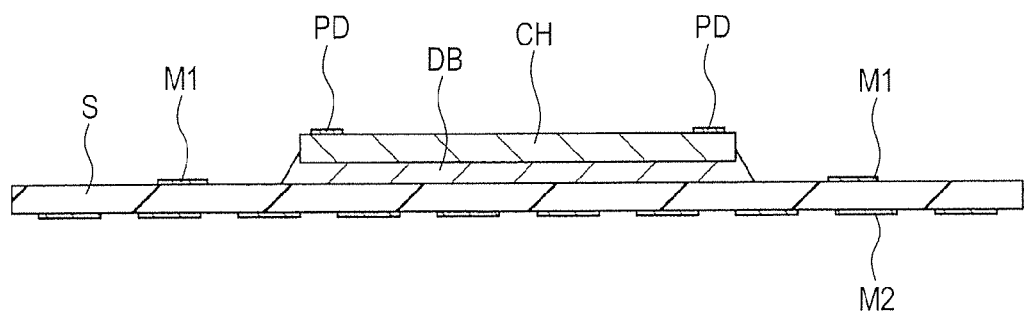
FIG. 5 is a sectional view illustrating the manufacturing process of the semiconductor device of the first embodiment.

Subsequently, as illustrated in FIG. 5, each semiconductor chip CH is bonded onto the substrate S (die bonding step S3). For example, the semiconductor chips CH on the UV dicing tape are irradiated with UV light to reduce adhesive strength of the UV tape. Subsequently, the surface side of the semiconductor chip CH is suctioned by a collet (suction component), and is pressed to the substrate S that is beforehand coated with an adhesive (resin paste) while the surface is separated from the UV tape. Subsequently, the adhesive is cured by heating treatment or the like. Conductive portions (portions of an interconnection, pad regions) M1 and M2 such as printed wirings are previously provided on the surface and the back, respectively, of the substrate S. Such conductive portions M1 and M2 are coupled to each other by a via that is provided so as to penetrate through the substrate S.

Figure 6:
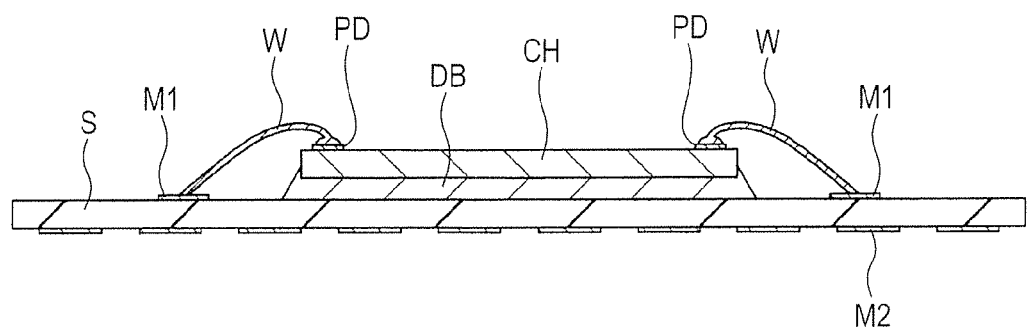
FIG. 6 is a sectional view illustrating the manufacturing process of the semiconductor device of the first embodiment, showing a manufacturing step following FIG. 5.

Subsequently, as illustrated in FIG. 6, each pad region PD of the semiconductor chip CH is coupled to each conductive portion M1 of the substrate S by the bonding wire W (wire bonding step S4). The bonding wire W may include a metal such as gold, copper, and aluminum. For example, a molten ball is formed on one end of a metal wire, and is bonded onto the pad region PD while being crushed (ball bonding). The other end of the wire is thermally welded to the conductive portion M1 of the substrate S (wedge bonding). In addition, the wire bonding may be performed by thermocompression bonding with an ultrasonic wave.

Subsequently, as illustrated in FIGS. 7 to 10, the peripheries of the semiconductor chip CH and the bonding wires W are collectively covered by a sealing resin (molding resin) MR (molding step S5). The semiconductor chip CH and the bonding wires W are thus covered with the sealing resin MR, and thus are prevented from being damaged by mechanical external force. Consequently, entering of water and adhesion of dust can be prevented. The resin material may include a thermosetting resin containing graphene particles. The particle size (average diameter) of the graphene particles GR to be added is, for example, 10 to 500 µm, and the particles may include particles formed by granulating a monolayer or multilayer film of graphene. The particles may further include particles formed by compacting pulverized material (granular material, powdery material) of graphene with resin or the like. Furthermore, the added amount of the graphene particles GR may be adjusted to 50 vol % or less.

Figure 7:
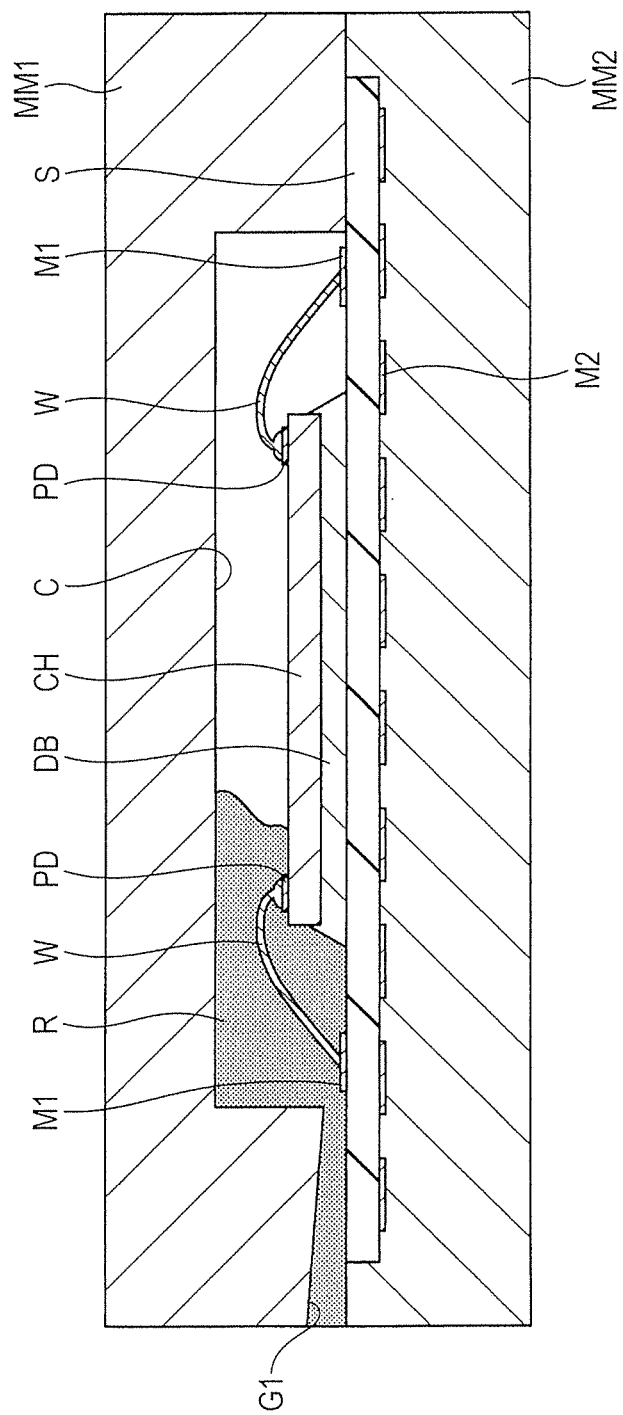
FIG. 7 is a sectional view illustrating the manufacturing process of the semiconductor device of the first embodiment, showing a manufacturing step following FIG. 6.
Figure 8:
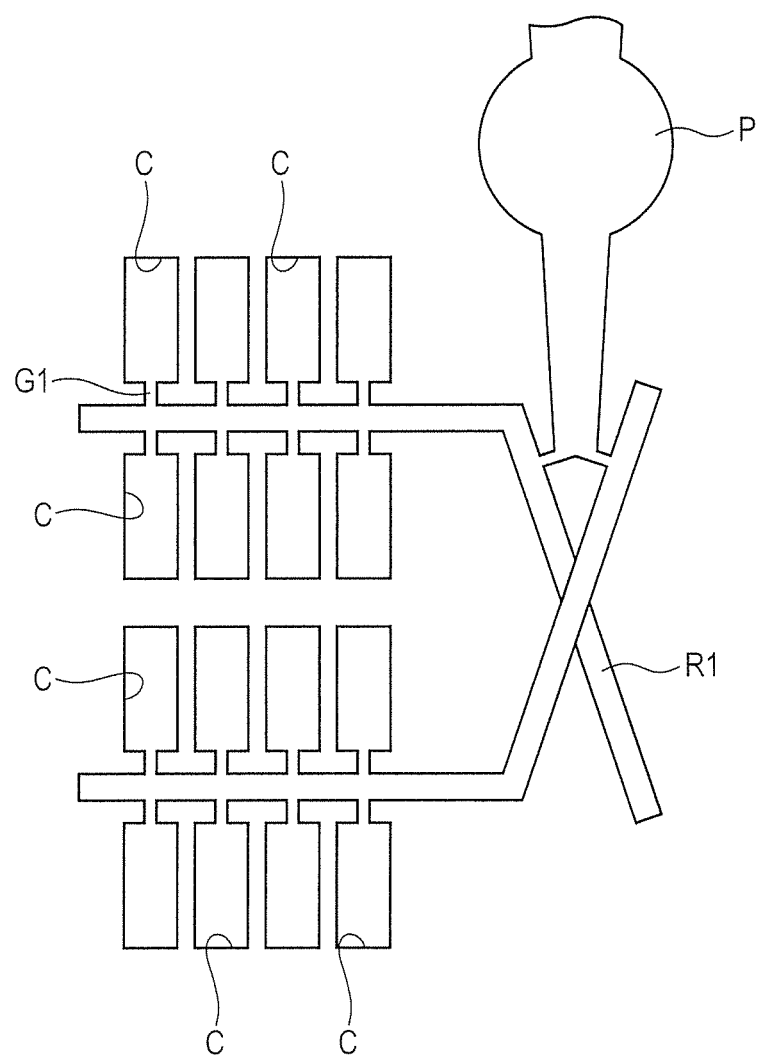
FIG. 8 illustrates the manufacturing process of the semiconductor device of the first embodiment.
Figure 9:
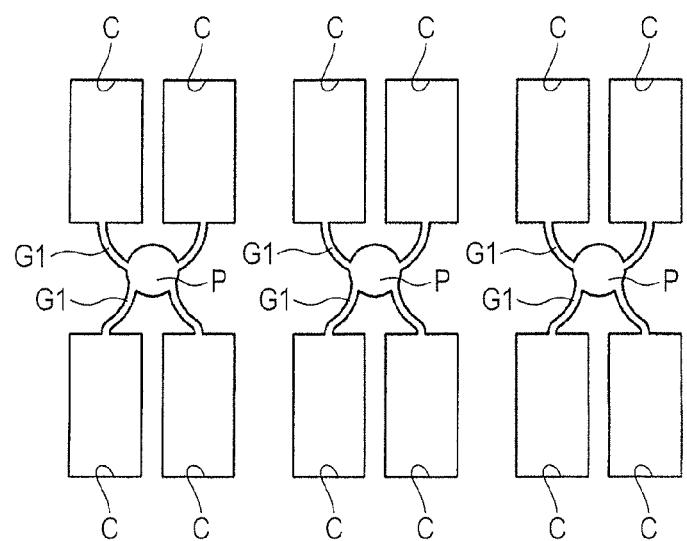
FIG. 9 illustrates the manufacturing process of the semiconductor device of the first embodiment.
Figure 10:
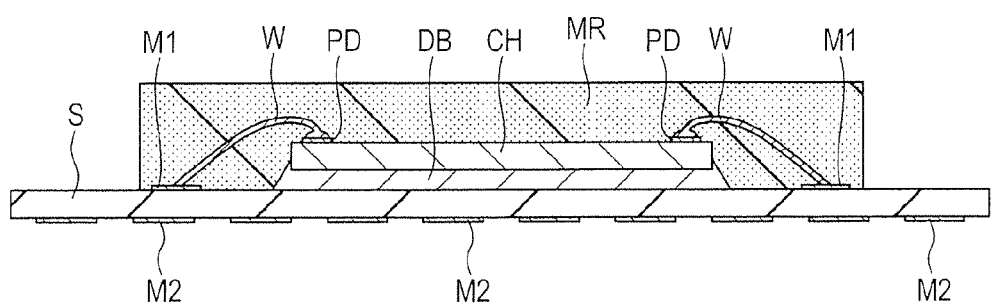
FIG. 10 is a sectional view illustrating the manufacturing process of the semiconductor device of the first embodiment, showing a manufacturing step following FIG. 7.

For example, as illustrated in FIG. 7, the substrate S is clamped by an upper metal mold MM1 and a lower metal mold MM2. A cavity C, in which the semiconductor chip CH and the bonding wires W are to be disposed, is provided between the upper metal mold MM1 and the lower metal mold MM2. A liquid resin (here, a thermosetting resin containing graphene particles) R is injected through a gate (an inflow port) C1 so as to fill the inside of the cavity C. Although only one cavity C is shown in FIG. 7, the liquid resin R is injected into a plurality of cavities C from a pot P. For example, as illustrated in FIG. 8, the liquid resin R is injected into the cavities C from a relatively large pot P through a runner (channel) R1 (pot method). As illustrated in FIG. 9, a plurality of small pots P may be provided to reduce a distance from each pot P to the cavity C (multi-pot method). The cavity C is filled with the liquid resin (here, a thermosetting resin containing graphene particles) R, and then the thermosetting resin is cured through heat treatment, and then the metal molds are removed (FIG. 10).

Figure 11:
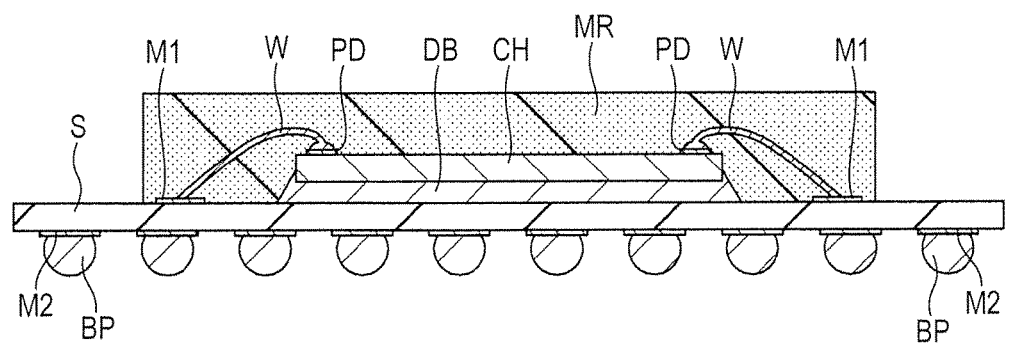
FIG. 11 is a sectional view illustrating the manufacturing process of the semiconductor device of the first embodiment, showing a manufacturing step following FIG. 10.

Subsequently, as illustrated in FIG. 11, a solder ball is formed on each conductive portion M2 of the substrate S (solder ball formation step S6). For example, the solder ball is fixed onto the conductive portion M2 of the substrate S with an undepicted solder paste.

Subsequently, for example, when a plurality of semiconductor devices are being linked to one another by a sealing resin, the semiconductor devices are separated from one another and molded (singulation step S7). Subsequently, a surface of each semiconductor device (for example, a surface of the sealing resin MR) is engraved with a model number of a product and the like (marking step S8).

According to the first embodiment, since the graphene particles GR are thus mixedly added in the sealing resin MR, thermal conduction of the sealing resin MR is improved, and thus radiation performance can be improved.

Figure 12:
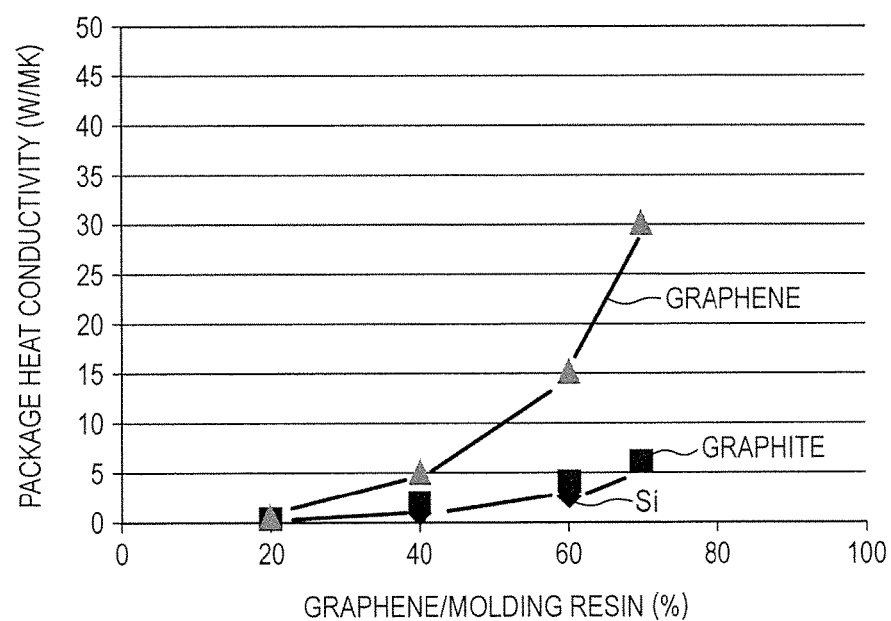
FIG. 12 is a graph showing thermal conductivity of each of molding resins containing various added materials.

FIG. 12 is a graph showing thermal conductivity of each of molding resins containing various added materials. The abscissa shows a filler ratio (filler/molding resin (%)), and the ordinate shows thermal conductivity (W/MK). As illustrated in FIG. 12, when 70 vol % of graphene is contained as filler in the sealing resin (package) MR, thermal conductivity is 30 W/MK. When 60 vol % of graphene is contained, thermal conductivity is 15 W/MK. When graphite or Si is used as filler, thermal conductivity is 4 to 5 W/MK. Hence, graphene has a thermal conductivity three times larger than graphite or Si. The filling limit of graphene is about 70 vol %. A range of the added amount of graphene is preferably 40 vol % or more, more preferably 50 vol % or more, further preferably 60 vol % or more. The thermal conductivity of the sealing resin MR is about 1 to 2 W/MK.

Figure 13:
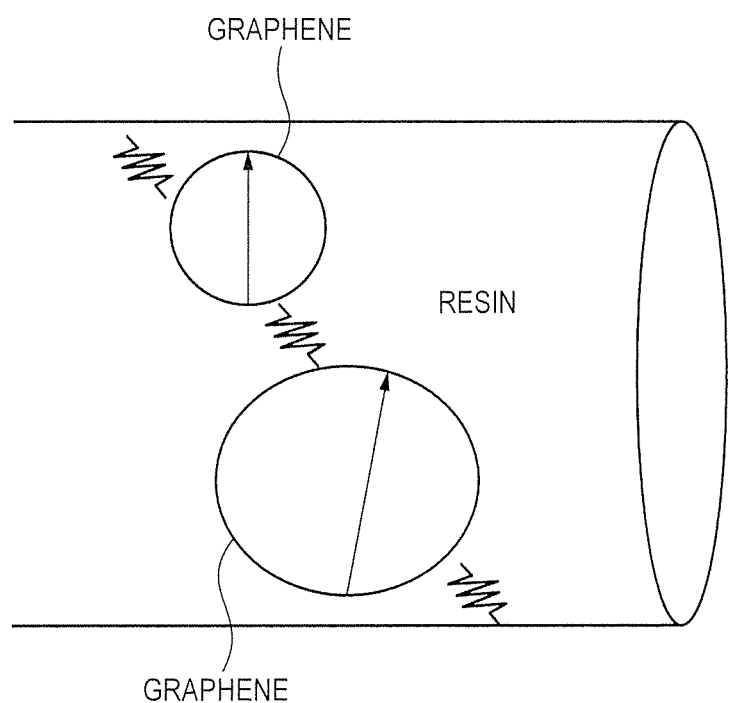
FIG. 13 schematically illustrates a relationship between heat transfer filler in a sealing resin and thermal conductivity.

FIG. 13 schematically illustrates a relationship between heat transfer filler (for example, Si, graphite, and graphene) in the sealing resin and thermal conductivity. Formula (1) in the bottom of the drawing is Bruggeman formula. The Bruggeman formula shows that even if a material having a high thermal conductivity is added as the heat transfer filler, thermal conductivity is not increased in a proratable manner. This is because thermal conductivity is dominated by the amount of resin around the heat transfer filler (FIG. 13). According to the percolation model, when the heat transfer filler exceeds 70% in volume ratio (vol %), heat transfer abruptly increases. Hence, the added amount of graphene is most preferably about 70 vol % as the filling limit.

Figure 14:
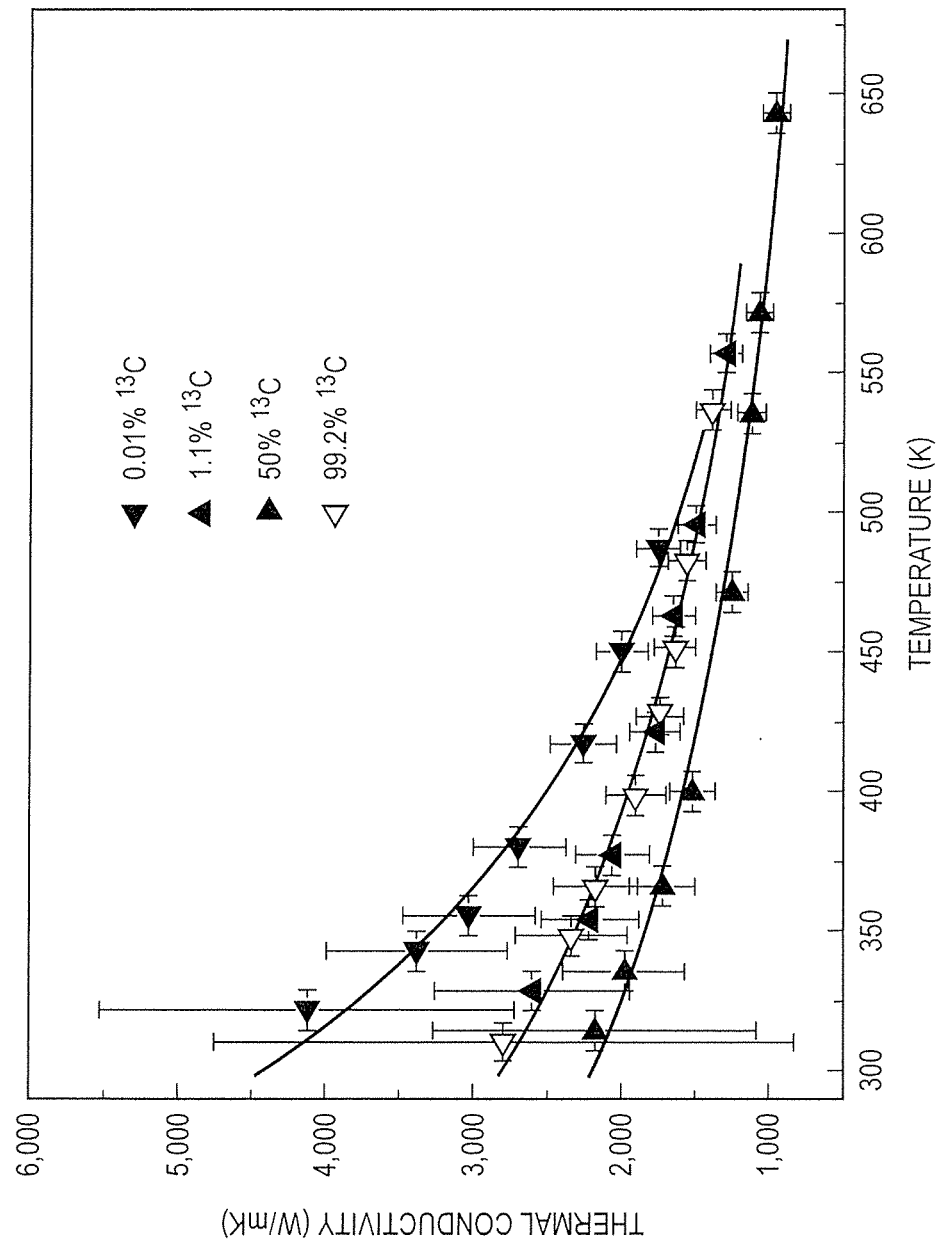
FIG. 14 is a graph showing a relationship between impurity amount in graphene and thermal conductivity.

FIG. 14 is a graph showing a relationship between impurity amount in graphene and thermal conductivity. The graph shows temperature dependence of thermal conductivity for the impurity amounts (wt %) in graphene of 0.01%, 1.1%, 50%, and 99.2%. The abscissa shows temperature (K), and the ordinate shows thermal conductivity (W/mK). Graphene has a thermal conductivity equal to or higher than that of graphite (2000 W/mK). When the amount of impurity increases, thermal conductivity tends to be reduced. Hence, graphene having a low impurity content is preferred to be used to increase thermal conductivity. On the other hand, thermal conductivity can be controlled by impurity addition. The impurity may include the above-described potassium ion.

Conclusion

As described in detail hereinbefore, according to the first embodiment, since the graphene particles GR are mixedly added in the sealing resin MR, thermal conduction of the sealing resin MR is improved, and thus radiation performance can be improved.

The particle size of the graphene particles GR may be adjusted to 10 to 500 µm, for example.

The range of the added amount of the graphene particles GR is 40 to 70 vol %, preferably 50 to 70 vol %, more preferably 60 to 70 vol %.

The thermal conductivity of the sealing resin can be controlled by adding the impurity (for example, potassium ion) into the sealing resin MR.

In particular, for a small device such as a mobile terminal, a forced-air cooling unit such as a fan is difficult to be used, and a radiation design is significantly important for the small device due to demands of smaller size and higher performance; hence, the sealing resin mixedly containing the graphene particles is preferably used. This prevents thermal runaway caused by overheat, and design life (Tj max) can be prolonged. For example, in a main technique of an existing mobile terminal, power consumption is controlled by PMIC or a power voltage management technique, and when consumed power reaches Tj max, a current value or frequency is typically decreased to reduce Joule heat. However, if Tj max can be maintained, the current value or frequency is not necessary to be decreased, and device performance can by maximized.

Although the semiconductor chip CH is mounted on the substrate S in FIG. 1, the semiconductor chip may be directly mounted on a housing for a small device such as a mobile terminal. In such a case, the periphery of the semiconductor chip CH is also covered with the sealing resin mixedly containing graphene particles. In this case, not only the semiconductor chip CH but also the housing itself can be improved in radiation performance.

Second Embodiment

In a second embodiment, applications of the first embodiment are described.

First Application

Although the sealing resin mixedly containing graphene particles is used as a sealing resin covering the semiconductor chip in the first embodiment (FIG. 1), an underfill material mixedly containing graphene particles may be used as a so-called flip-chip underfill material.

Figure 15:
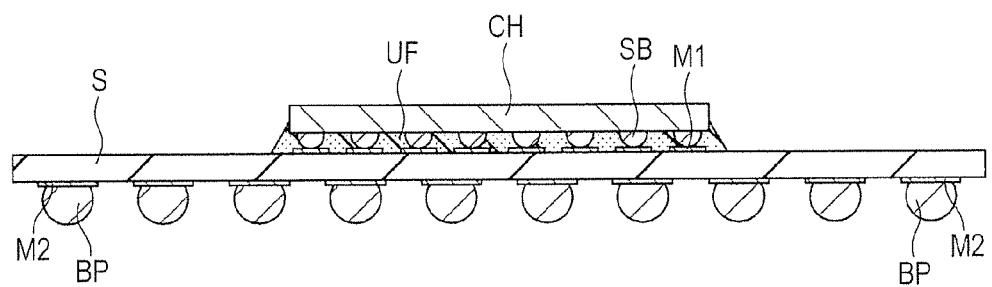
FIG. 15 is a sectional view illustrating a configuration of a semiconductor device of a first application of a second embodiment.
Figure 16:
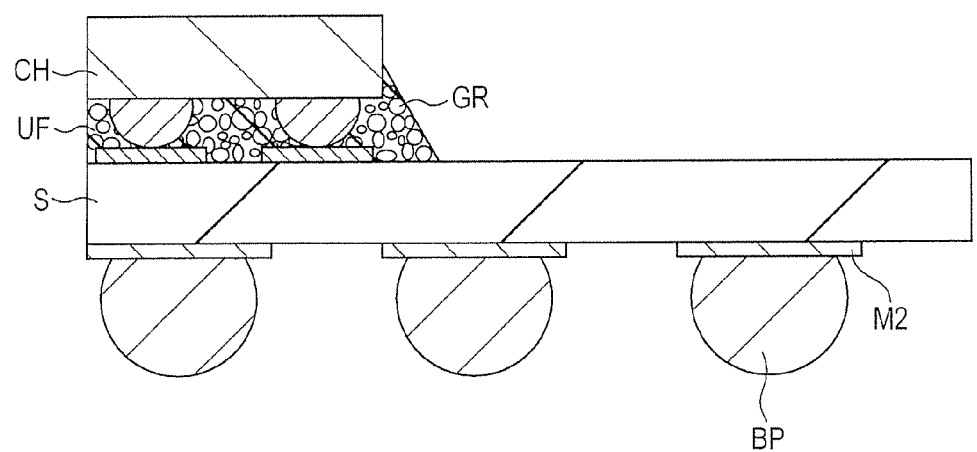
FIG. 16 is a sectional view illustrating the configuration of the semiconductor device of the first application of the second embodiment.

FIGS. 15 and 16 are each a sectional view illustrating a configuration of a semiconductor device of a first application of the second embodiment. FIG. 16 is a partial enlarged view of FIG. 15.

The semiconductor device illustrated in FIG. 15 is a flip-chip-packaged semiconductor device. The flip-chip packaging is a method of packaging a semiconductor chip on a substrate, in which a surface of the semiconductor chip is electrically coupled to the substrate by protrusive terminals called bumps (here, stud bumps) arranged in an array rather than bonding wires as in the first embodiment.

Stud bumps SB are provided on the back of the semiconductor chip CH illustrated in FIG. 15. The stud bumps SB are arranged in an array, for example. Conductive portions (portions of an interconnection, pad regions) M1 are provided on the surface of the substrate S. The stud bumps SB of the semiconductor chip CH are electrically coupled to the conductive portions M1 of the substrate S. Specifically, the back side of the semiconductor chip CH is coupled to the surface side of the substrate S via the stud bumps SB and the conductive portions M1. Bump electrodes BP are provided on the back of the substrate S with conductive portions (portions of an interconnection, pad regions) M2 in between.

A gap between the back of the semiconductor chip CH and the surface of the substrate S is filled with an underfill material UF. The underfill material UF serves as a buffer layer. The underfill material UF contains the graphene particles GR (FIG. 16). The graphene particles GR are thus mixedly added in the underfill material UF, thereby thermal conduction of the underfill material UF is improved, and thus radiation performance is improved.

A resin for the underfill material UF may include, but not limited to, thermosetting resin such as epoxy resin, phenol resin, and melamine resin, for example.

Figure 17:
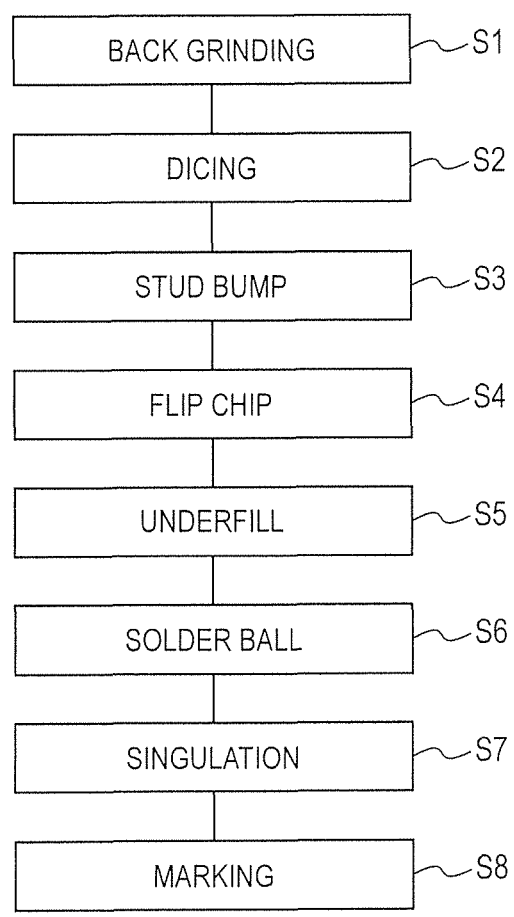
FIG. 17 is a flowchart of a manufacturing process of the semiconductor device of the first application of the second embodiment.
Figure 18:
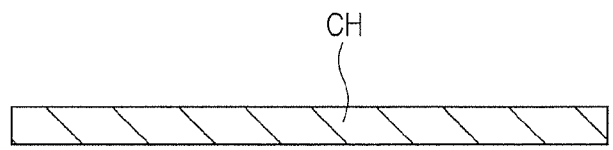
FIG. 18 is a sectional view illustrating the manufacturing process of the semiconductor device of the first application of the second embodiment.
Figure 19:
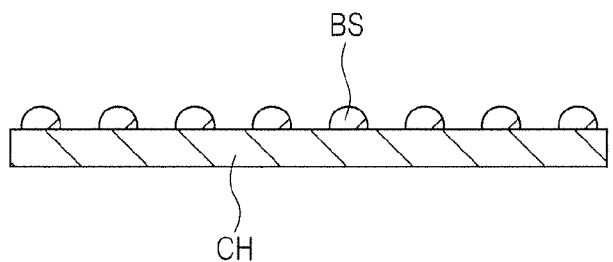
FIG. 19 is a sectional view illustrating the manufacturing process of the semiconductor device of the first application of the second embodiment, showing a manufacturing step following FIG. 18.
Figure 20:
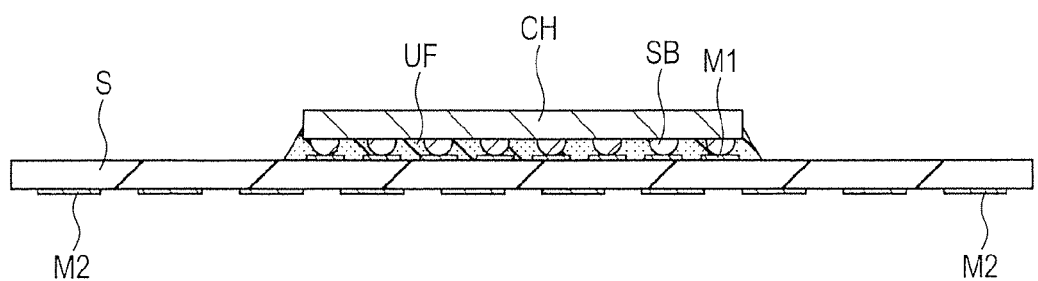
FIG. 20 is a sectional view illustrating the manufacturing process of the semiconductor device of the first application of the second embodiment, showing a manufacturing step following FIG. 19.

Subsequently, a manufacturing process of the semiconductor device of the second embodiment is described, while a structure of the semiconductor device of the second embodiment is more clarified. FIG. 17 is a flowchart of a manufacturing process of the semiconductor device of the first application of the second embodiment. FIGS. 18 to 20 are each a sectional view illustrating the manufacturing process of the semiconductor device of the first application of the second embodiment.

As illustrated in FIG. 17, the procedure of the manufacturing process of the semiconductor device of the second embodiment includes a back grinding step S1, a dicing step S2, a stud bump formation step S3, a flip-chip packaging step S4, an underfill filling step S5, a solder ball formation step S6, a singulation step S7, and a marking step S8.

The semiconductor chip illustrated in FIG. 18 is a cut product from a wafer. The wafer is a roughly circular sheet component including a semiconductor such as Si. Semiconductor elements such as MISFETs are formed on the main surface of the wafer, and are coupled via a plurality of interconnection layers. A protective film is provided on a top-layer interconnection, and a portion of the top-layer interconnection exposed from an opening of the protective film serves as the pad region. The pad regions are disposed in an array, for example. Although MISFET is shown as an example of the semiconductor element, another storage element such as DRAM or flash memory may be formed as the semiconductor element.

The back of the wafer is ground (back grinding step S1) after the formation step of the semiconductor elements and interconnections (upstream process), and then the wafer is cut by individual chip regions (dicing step S2). Such steps are the same as those in the first embodiment. Consequently, the individual semiconductor chips CH are formed (FIG. 18).

Subsequently, as illustrated in FIG. 19, the stud bumps SB are formed on the back of the semiconductor chip CH (stud bump formation step S3). A material for the stud bump may include a metal such as gold, for example. For example, a gold wire in a capillary is discharge-molten to form a molten ball, and the molten ball is bonded onto the undepicted pad region of the semiconductor chip CH while being crushed. Subsequently, the wire is cut, and leveling is performed to uniform the bump heights as necessary. Gold purity of the gold wire maybe lower than the gold purity of the gold wire used in the wire bonding step. In the stud bump configuration, since no loop is provided, the amount of the wire to be used is smaller than that in the wire bonding step. The capillary used in the stud bump formation step is not necessary to be designed inconsideration of a loop and a second bonding step. In the stud bump configuration, a face angle is 0°, and no loop is provided, which eliminates a need of considering contact between wires, and thus eliminates a need of using a bottleneck capillary having a narrow end.

Subsequently, as illustrated in FIG. 20, the stud bumps SB are aligned with the conductive portions M1 of the substrate S with the formation side of each stud bump SB of the semiconductor chip CH facing down, and the stud bumps SB are coupled to the conductive portions M1 (flip-chip packaging step S4). Subsequently, a gap between the semiconductor chip CH and the substrate S is filled with a liquid underfill material containing the graphene particles GR. For example, the liquid underfill material is supplied from the periphery of the semiconductor chip CH and poured into the gap between the back of the semiconductor chip CH and the substrate S. Subsequently, the liquid underfill material is cured through heat treatment.

A resin configuring the underfill material UF may include a thermosetting resin, for example. The particle size (average diameter) of the graphene particles GR to be added is 1 to 100 μm, for example. Graphene particles GR having a particle size smaller than that in the first embodiment are used in consideration of size (for example, about 0.5 mm) of a gap between the semiconductor chip CH and the substrate S. The particles may include particles formed by granulating a monolayer or multilayer film of graphene. The particles may further include particles formed by compacting pulverized material (granular material, powdery material) of graphene with resin or the like. Furthermore, the added amount of the graphene particles GR may be adjusted to 30 vol % or less. Although a larger added amount of the graphene particles GR leads to higher thermal conduction, an excessively large amount of the graphene particles GR causes a cured material to be hard and fragile. In addition, permeability is deteriorated during filling, and voids are easily formed. Hence, the added amount of the graphene particles GR is preferred to be 30 vol % or less. The particle size and added amount of the graphene particles GR and the resin material are preferred to be appropriately adjusted to optimize viscosity or permeability of the underfill material so that voids are decreased.

Subsequently, a solder ball is formed on each conductive portion M2 of the substrate S (solder ball formation step S6). For example, the solder ball is fixed onto the conductive portion M2 of the substrate S with a solder paste (see FIG. 15).

Subsequently, for example, when a plurality of semiconductor devices are being linked to one another, the semiconductor devices are separated from one another and molded (singulation step S7). Subsequently, a surface of each semiconductor device (for example, a surface of the semiconductor chip CH) is engraved with a model number of a product and the like (marking step S8).

According to the second embodiment, since the graphene particles GR are thus mixedly added in the underfill material UF, thermal conduction of the underfill material UF is improved, and thus radiation performance can be improved.

In particular, for a small device such as a mobile terminal, small packaging area is often achieved by flip-chip packaging. Hence, thermal conduction of the underfill material UF is improved as in the first application, which makes it possible to prevent entering of water into a space between the semiconductor chip and the substrate and prevent adhesion of dust while radiation from the substrate is enhanced.

Second Application

Although the surface of the semiconductor chip is exposed in the first application, the sealing resin MR may be provided so as to cover the semiconductor chip CH.

Figure 21:
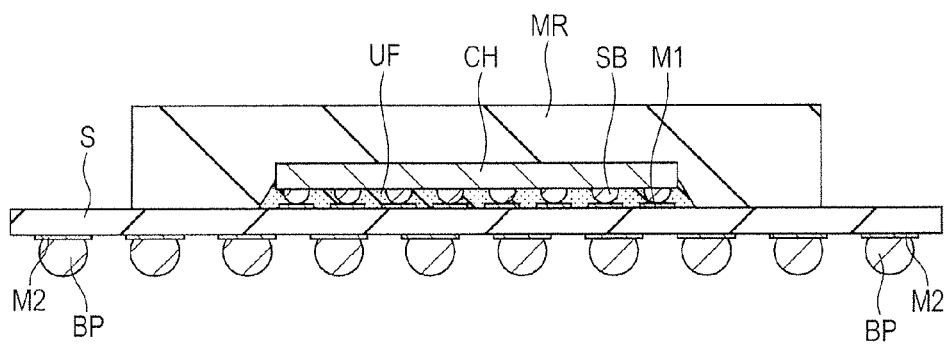
FIG. 21 is a sectional view illustrating a configuration of a semiconductor device of a second application of the second embodiment.

FIG. 21 is a sectional view illustrating a configuration of a semiconductor device of a second application of the second embodiment. Any configuration other than the sealing resin MR covering the semiconductor chip CH is the same as that in the first application.

The sealing resin MR illustrated in FIG. 21 may be a thermosetting resin that contains no graphene particle GR, or the thermosetting resin containing the graphene particles GR as described in the first embodiment.

A flip-chip-packaged semiconductor device may be designed such that the thermosetting resin containing the graphene particles GR as described in the first embodiment is used as the sealing resin MR covering the semiconductor chip CH, while the thermosetting resin that contains no graphene particle GR is used as the underfill material UF.

Third Application

Figure 22:
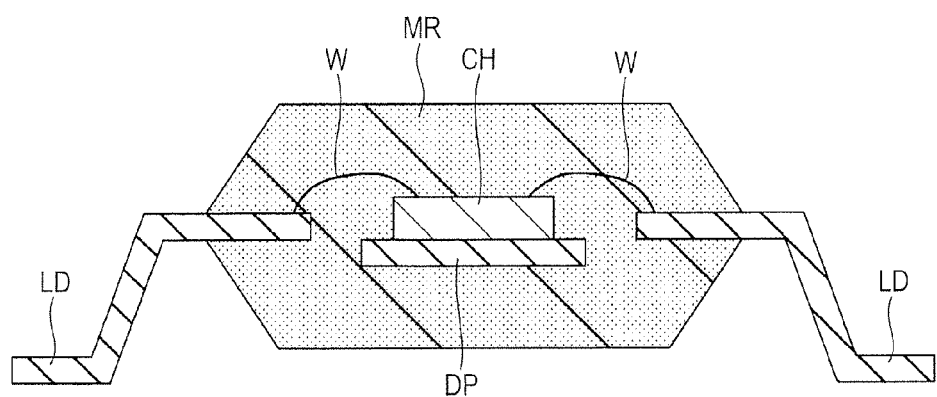
FIG. 22 is a sectional view illustrating a configuration of a semiconductor device of a third application of the second embodiment.

In a third application, an example of application to a leadframe package product is described. FIG. 22 is a sectional view illustrating a configuration of a semiconductor device of the third application of the second embodiment.

The semiconductor device illustrated in FIG. 22 includes a semiconductor chip CH, a die pad DP having the semiconductor chip CH thereon, and leads LD. Each pad region of the semiconductor chip CH is coupled to each lead LD by a bonding wire W. The periphery of the semiconductor chip CH and one end of each lead LD are covered with the sealing resin MR.

The back of the wafer is ground (back grinding step S1) after the formation step of the semiconductor elements and interconnections (upstream process), and then the wafer is cut by individual chip regions (dicing step S2). Subsequently, each semiconductor chip CH is bonded onto the die pad DP in the leadframe (die bonding step). The leadframe includes the die pad DP and a plurality of leads LD disposed around the die pad DP. Subsequently, each pad region of the semiconductor chip CH is coupled to each lead LD by the bonding wire W (wire bonding step).

Subsequently, the leadframe is clamped by an upper metal mold and a lower metal mold, and a liquid resin (here, a thermosetting resin containing graphene particles) R is injected into a cavity. Subsequently, the thermosetting resin is cured through heat treatment to form the sealing resin MR.

Subsequently, unnecessary portions of the leadframe are cut off so that each lead LD projected from the sealing resin MR is formed into a desired shape.

In this way, in the third application, the graphene particles GR are also mixedly added in the sealing resin MR, thereby thermal conduction of the sealing resin MR is improved, and thus radiation performance can be improved.

Third Embodiment

Although graphene particles are mixedly added in the sealing resin in the first embodiment, a graphene block (graphene mass, graphene sheet) may be embedded in the sealing resin.

A semiconductor device of a third embodiment is now described in detail with reference to the accompanying drawings.

Description of Structure

Figure 23:
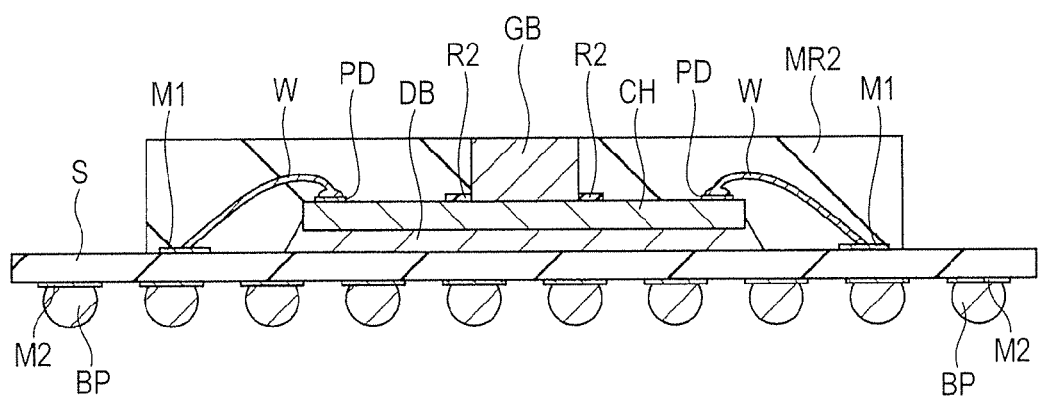
FIG. 23 is a sectional view illustrating a configuration of a semiconductor device of a third embodiment.
Figure 24:
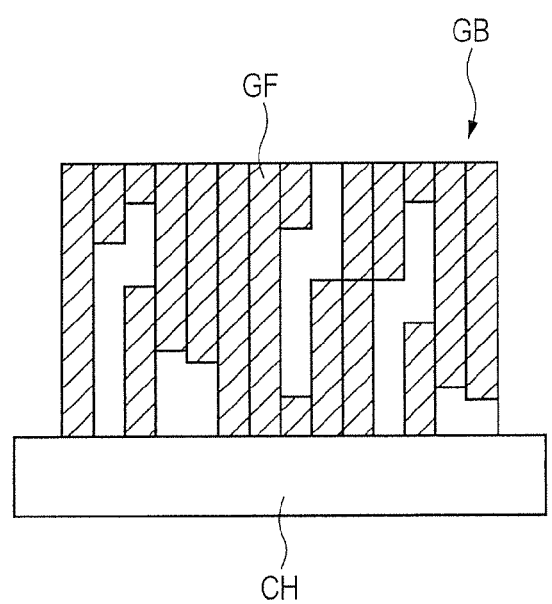
FIG. 24 is a sectional view schematically illustrating a configuration of a graphene block.

FIG. 23 is a sectional view illustrating a configuration of the semiconductor device of the third embodiment. FIG. 24 is a sectional view schematically illustrating a configuration of a graphene block.

As with the first embodiment, the semiconductor device illustrated in FIG. 23 includes a semiconductor chip CH and a sealing resin MR2 covering the semiconductor chip CH. The semiconductor chip CH is bonded onto a substrate (mounting board, interconnection substrate) S with a die-bonding material (for example, resin paste) DB. Pad regions PD are provided on the top of the semiconductor chip CH. For example, each pad region PD corresponds to a portion (an exposed region) of a top-layer interconnection provided in the semiconductor chip. Each pad region PD of the semiconductor chip CH is coupled to each conductive portion (a portion of an interconnection, a pad region) M1 provided on a surface of the substrate S via a bonding wire W. Bump electrodes BP are each provided on the back of the substrate S with a conductive portion (a portion of an interconnection, a pad region) M2 in between.

The sealing resin MR2 is provided so as to cover the semiconductor chip CH, and a graphene block GB is embedded in the sealing resin MR2. Specifically, the graphene block GB is fixed onto the semiconductor chip CH with an adhesive R2, and the surface of the graphene block GB is exposed from the sealing resin MR2.

The graphene block GB is a stacked body of graphene flakes (monolayer graphene, graphene sheets, graphene pieces) GF. Each graphene flake GF is a planarly spreading fragment of graphene. A stacked direction of the graphene flakes GF is a direction parallel to the surface of the semiconductor chip CH. In other words, the graphene flakes GF are disposed in a direction perpendicular to the surface of the semiconductor chip CH.

The graphene block GB as a stack of the graphene flakes GF, which are thus disposed in the direction perpendicular to the surface of the semiconductor chip CH, is used as a heatsink, thereby radiation performance of the semiconductor device can be improved. Since the graphene block GB continues from the semiconductor chip CH to the outside, thermal conduction efficiency is extremely improved. For example, a thermal conduction efficiency of about 3500 W/MK can be expected. Furthermore, the sealing resin MR2 contains no graphene particle, and thus only an insulative resin exists between the bonding wires W. This eliminates a need of considering a method of maintaining insulation of the bonding wire (insulating coating or adjustment of thermal conduction efficiency by potassium ion). Consequently, thermal conduction efficiency can be improved in a simple configuration.

Description of Manufacturing Method

Figure 25:
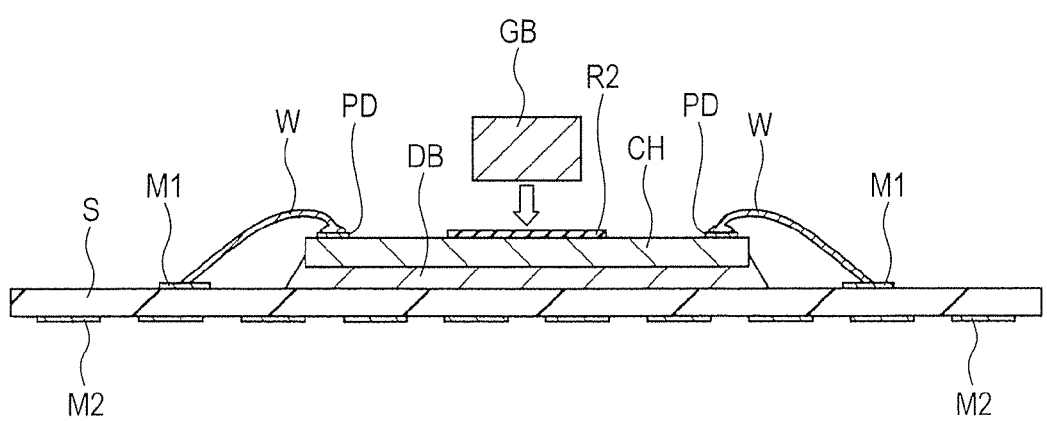
FIG. 25 is a sectional view illustrating a manufacturing process of the semiconductor device of the third embodiment.
Figure 26:
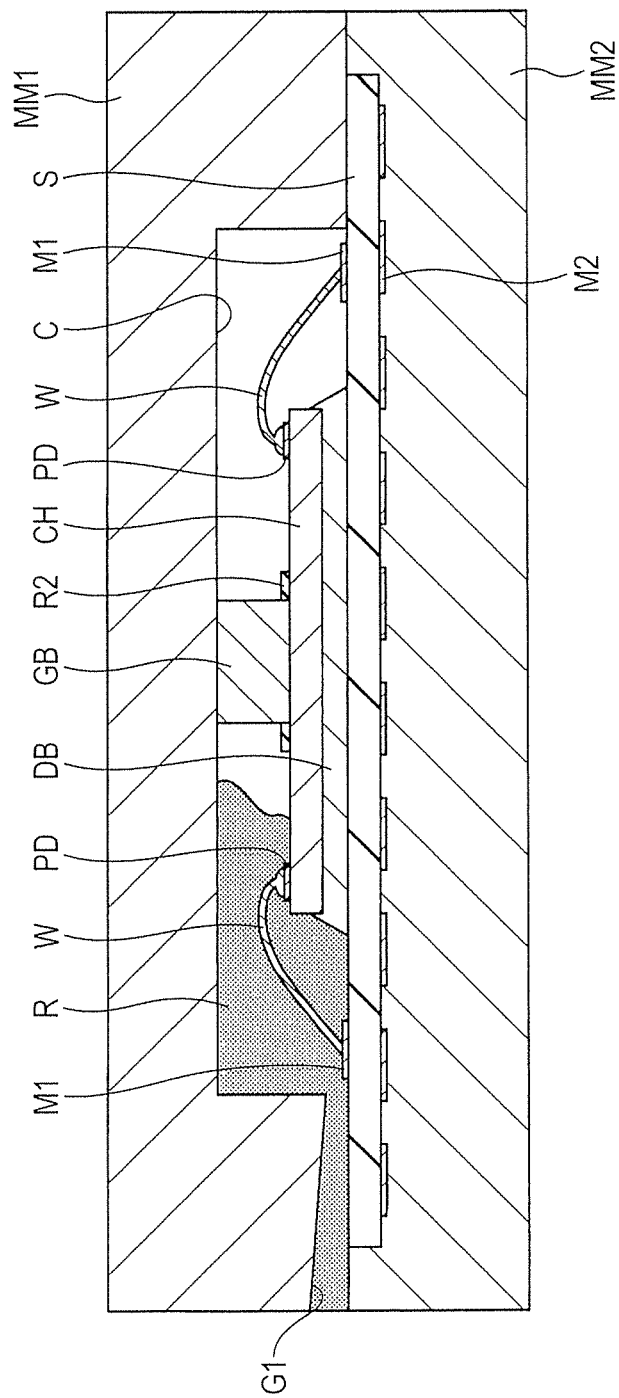
FIG. 26 is a sectional view illustrating the manufacturing process of the semiconductor device of the third embodiment, showing a manufacturing step following FIG. 25.

A manufacturing process of the semiconductor device of the third embodiment is now described. FIGS. 25 and 26 are each a sectional view illustrating a manufacturing process of the semiconductor device of the third embodiment. A step similar to that in the first or second embodiment is not described in detail.

As in the first embodiment, the back of the wafer is ground (back grinding step) after the formation step of the semiconductor elements and interconnections (upstream process), and then the wafer is cut by individual chip regions (dicing step). Subsequently, each semiconductor chip CH is bonded onto the substrate S (die bonding step, see FIG. 5). Subsequently, each pad region PD of the semiconductor chip CH is coupled to each conductive portion M1 of the substrate S by the bonding wire W (wire bonding step, see FIG. 6).

Subsequently, as illustrated in FIG. 25, the graphene block GB is bonded onto the semiconductor chip CH. For example, an adhesive R2 is applied onto the semiconductor chip CH, and the graphene block GB is pressed to the semiconductor chip CH. At this time, the graphene block GB is pressed such that the planar graphene flakes GF configuring the graphene block GB are arranged in a direction perpendicular to the semiconductor chip CH (see FIG. 24). Subsequently, the adhesive R2 is solidified, and thus the graphene block GB is fixed onto the semiconductor chip CH.

Subsequently, the peripheries of the semiconductor chip CH and the bonding wires W are collectively covered by a sealing resin (molding resin) MR2 (molding step). For example, as illustrated in FIG. 26, the substrate S is clamped by an upper metal mold MM1 and a lower metal mold MM2. The graphene block GB, the semiconductor chip CH, and the bonding wires W are disposed between the upper metal mold MM1 and the lower metal mold MM2. A liquid resin (here, thermosetting resin) R is injected into a cavity C so as to fill the inside of the cavity C. After the cavity C is filled, the thermosetting resin is cured through heat treatment. Consequently, the semiconductor chip CH and the bonding wires W can be covered with the sealing resin MR2. In addition, the graphene block GB and the semiconductor chip CH can be integrated. The surface of the graphene block GB is exposed from the sealing resin MR2.

After that, as in the first embodiment, the semiconductor device of the third embodiment can be formed through the solder ball formation step, the singulation step, and the marking step (see FIG. 17).

Formation Method of Graphene Block

An exemplary formation method of the graphene block is now described. FIGS. 27 to 33 are each a sectional view illustrating a formation process of the graphene block. However, FIGS. 30A and 30B includes a perspective view.

Figure 27:
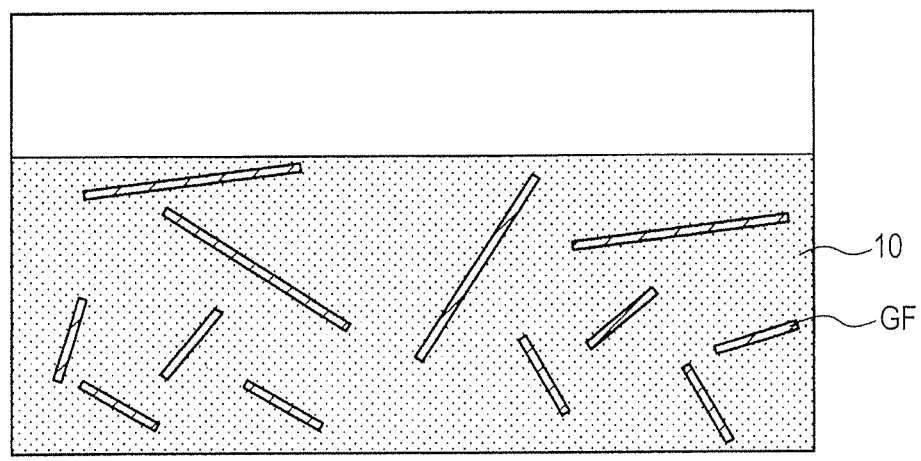
FIG. 27 is a sectional view illustrating a formation process of the graphene block.

As illustrated in FIG. 27, the graphene flakes GF are mixedly put into a solution 10 including an organic solvent dissolved in a vehicle such as water or alcohol. The average particle size of the graphene flakes GF is about 20 nm, for example.

Figure 28:
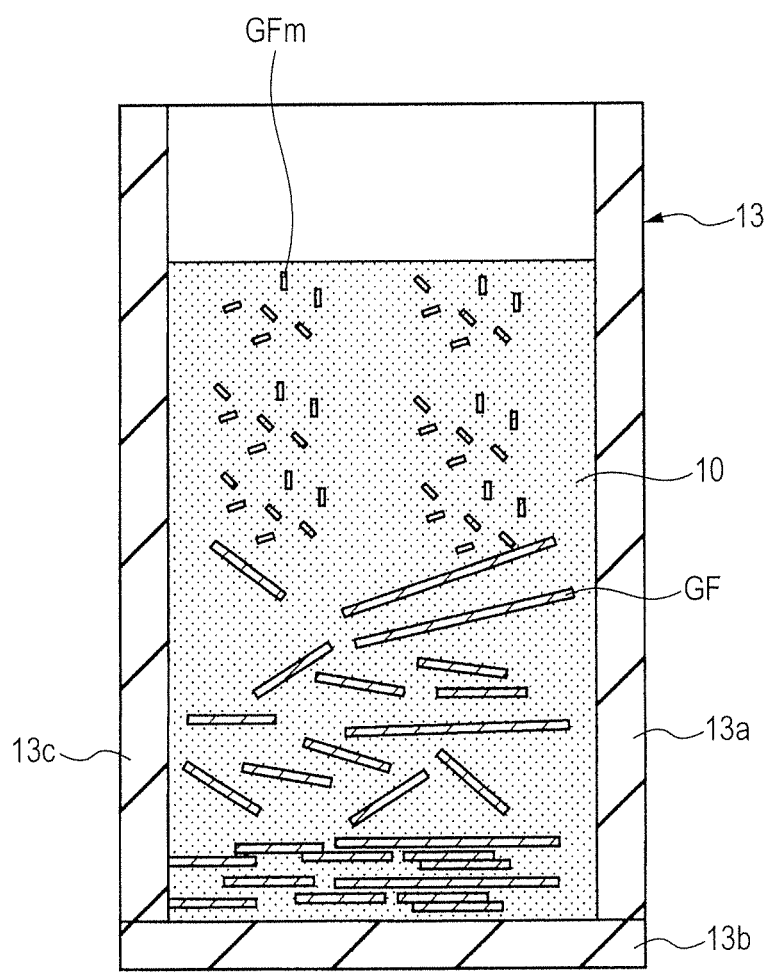
FIG. 28 is a sectional view illustrating the formation process of the graphene block.

Subsequently, as illustrated in FIG. 28, the solution mixed with the graphene flakes GF is put into a container 13, and is allowed to stand for a predetermined time (for example, about 24 hr). During such a period, the graphene flakes GF are precipitated. At this time, since the narrow surfaces of the graphene flakes GF are bad in stability against gravity, the graphene flakes GF are necessarily precipitated while their surfaces are arranged in order (FIG. 28). Small graphene flakes GFm of five nanometers square or less are suspended in the upper part of the solution.

Figure 29:
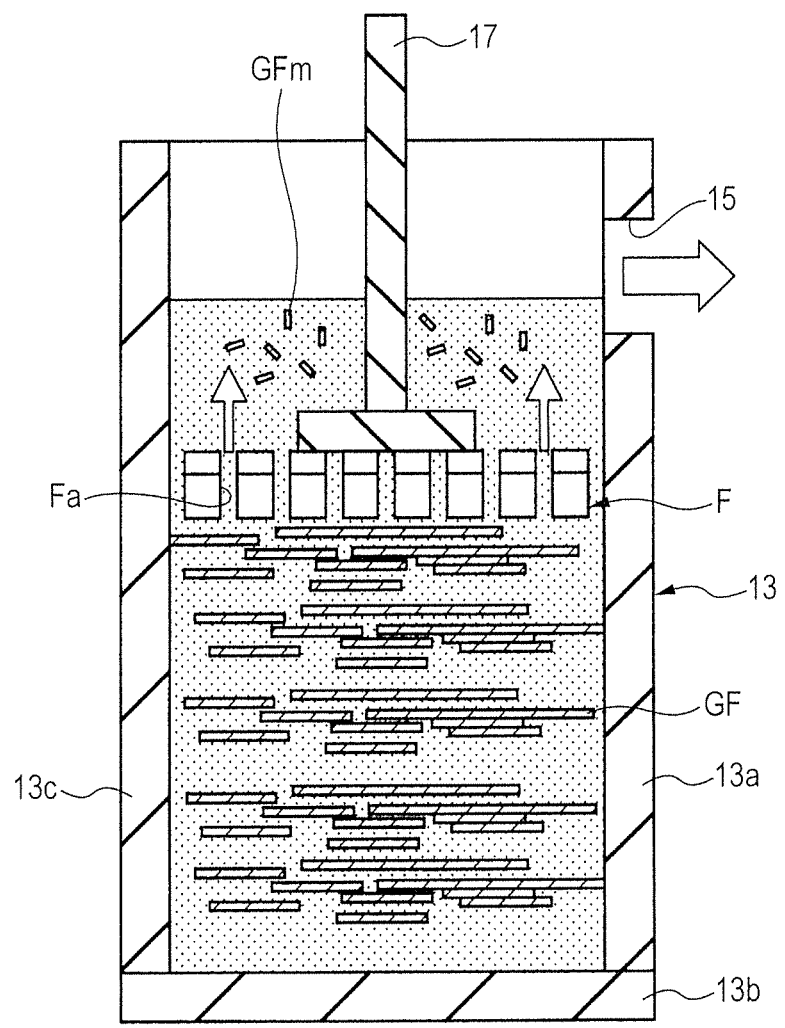
FIG. 29 is a sectional view illustrating the formation process of the graphene block.
Figure 30A:
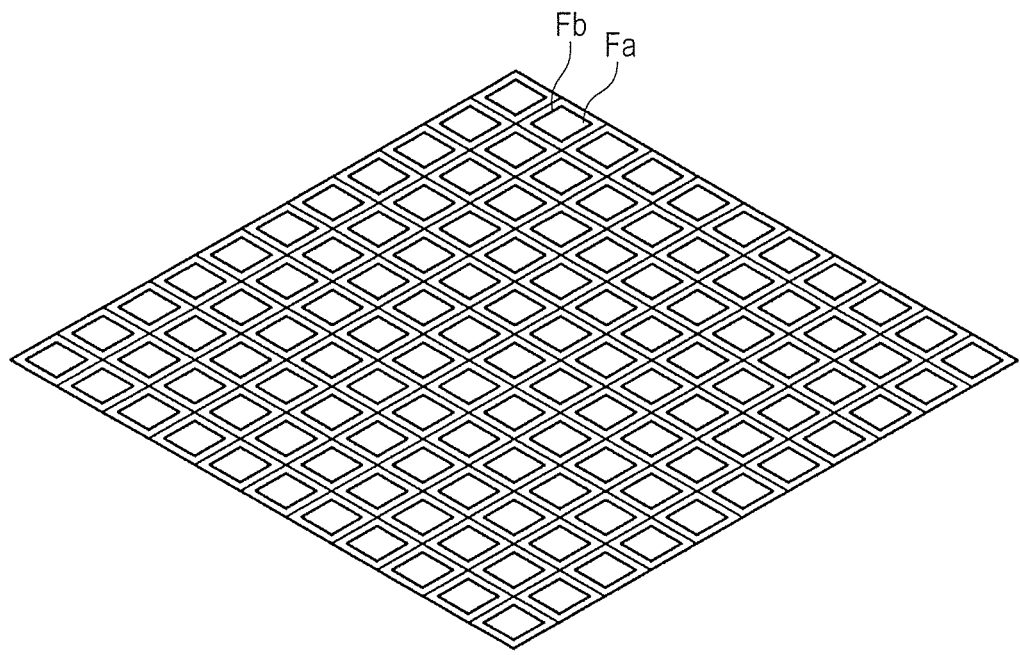
FIGS. 30A and 30B illustrate the formation process of the graphene block.
Figure 30B:
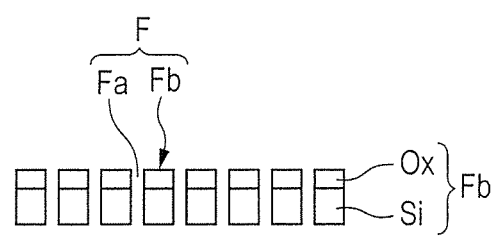

Subsequently, as illustrated in FIG. 29, a mesh filter F having a plurality of openings Fa, each having a size of 5 nm square, is pushed down from the upper part of the container 13 by a support rod 17. Consequently, the small graphene flakes GFm of 5 nm square or less are separated by the mesh filter F and removed through a ditch 15 together with the solution. The mesh filter F can be formed by exposing a so-called SOI substrate through a mesh. FIGS. 30A and 30B illustrates a configuration of the mesh filter. FIG. 30A is a perspective view of the mesh filter, and FIG. 30B is a sectional view thereof. A stacked film Fb of a silicon film Si and an oxide film Ox is disposed around the opening Fa.

Figure 31:
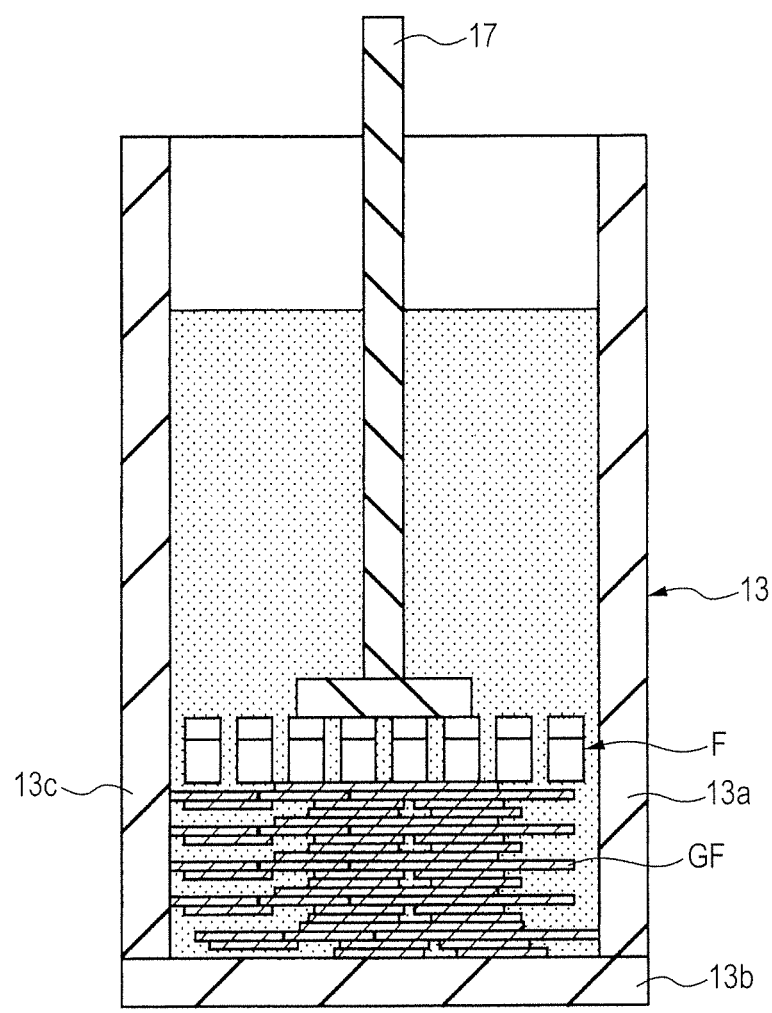
FIG. 31 is a sectional view illustrating the formation process of the graphene block.

Subsequently, as illustrated in FIG. 31, the support rod 17 is pushed down to densify the graphene flakes GF. The solution over the mesh filter F is drained, and the vehicle such as water or alcohol and the organic solvent are volatilized through heating or pressure regulation.

Figure 32:
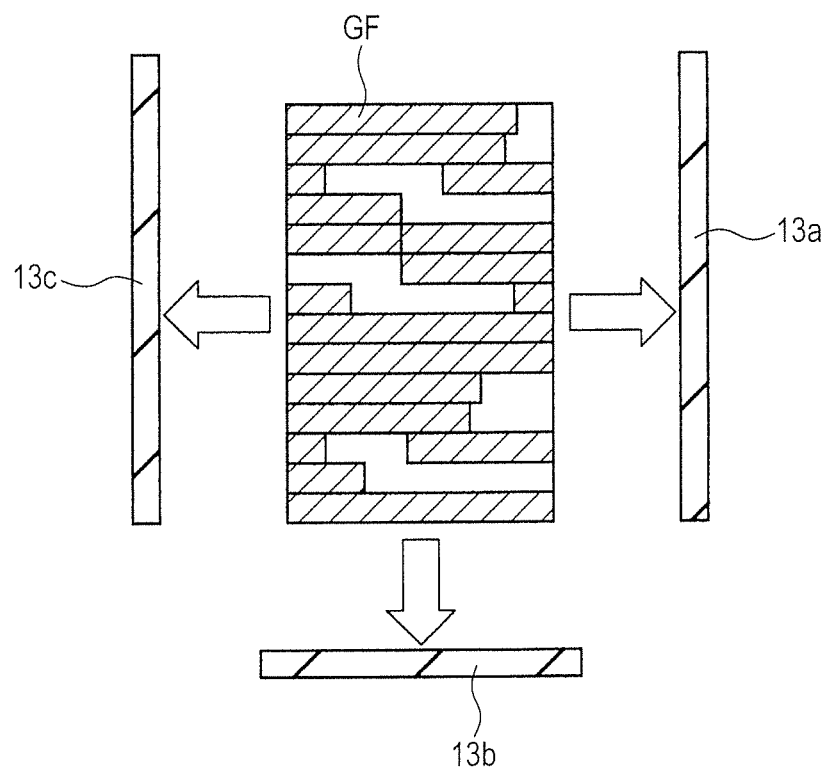
FIG. 32 is a sectional view illustrating the formation process of the graphene block.
Figure 33:
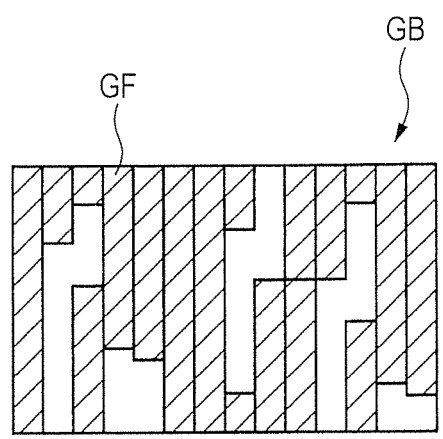
FIG. 33 is a sectional view illustrating the formation process of the graphene block.

Subsequently, as illustrated in FIG. 32, the bottom 13b and the sides 13a and 13c of the container 13 are removed to produce the graphene block GB as illustrated in FIG. 33.

The stacked graphene flakes GF may be fixed to one another by resin.

Fourth Embodiment

Although the graphene particles are used as the heat transfer filler and the graphene block is used as the heatsink in the first to third embodiments, a carbon nanotube may be used as a material for each of such components.

For example, particles formed by pulverization of a carbon nanotube may be used in place of the graphene particles in the first embodiment. The particle size of the carbon nanotube particles may be adjusted to 10 to 500 μm, for example. A range of added amount of the carbon nanotube particles to the sealing resin may be 40 to 70 vol %, preferably 50 to 70 vol %, more preferably 60 to 70 vol %. The particles formed by pulverization of a carbon nanotube may be used in place of the graphene particles in the first application of the second embodiment. The particle size of the carbon nanotube particles may be adjusted to 1 to 100 μm, for example. A range of added amount of the carbon nanotube particles to the sealing resin may be 30 vol % or less. The particles formed by pulverization of a carbon nanotube may be used in place of the graphene particles in the second of third application of the second embodiment.

A carbon nanotube block may be used in place of the graphene block GB in the third embodiment.

Figure 34:
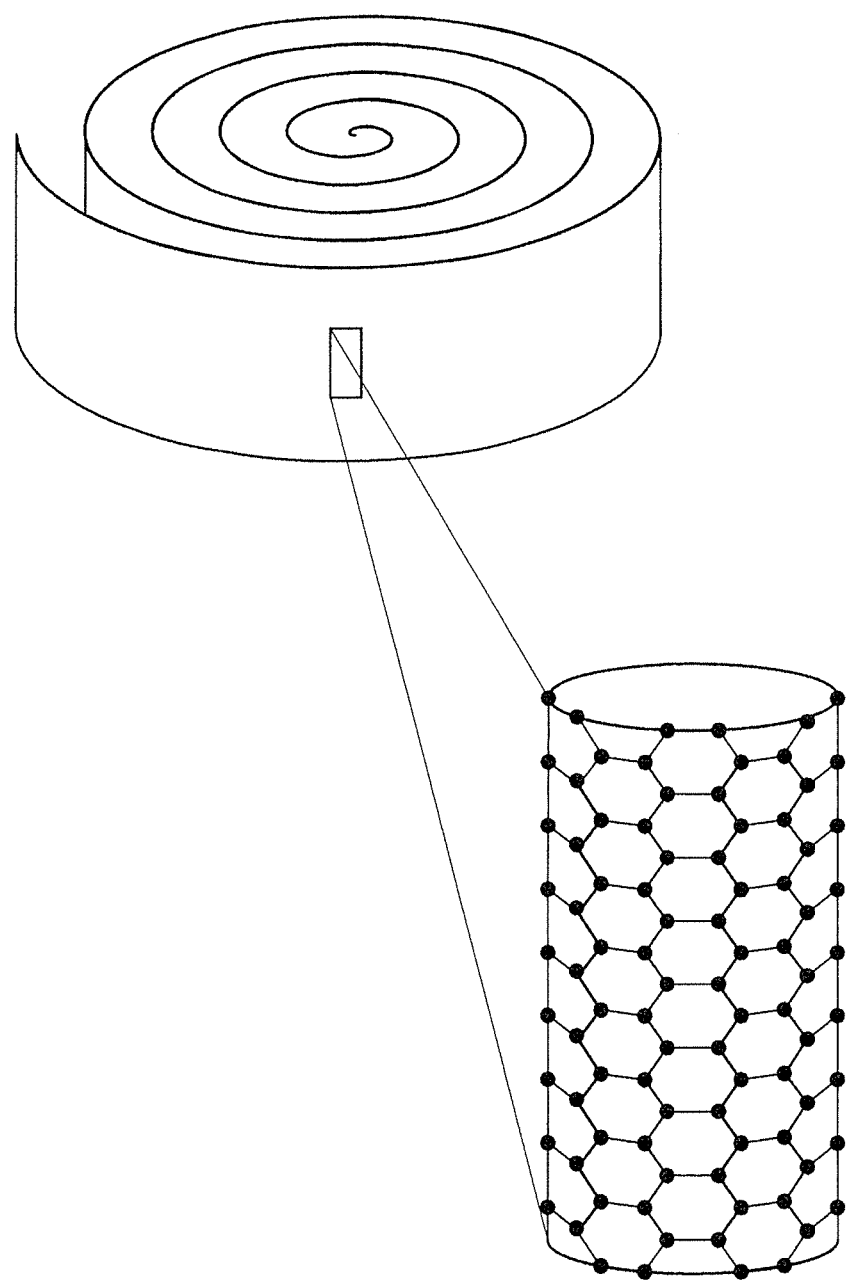
FIG. 34 is a perspective view illustrating a formation process of a carbon nanotube block.

FIG. 34 is a perspective view illustrating a formation process of the carbon nanotube block. Each black circle indicates a carbon atom. As illustrated in FIG. 34, a super-growth tape is wound. The super-growth tape includes a plurality of carbon nanotubes formed with a super-growth CVD process. For example, as illustrated in FIG. 34, carbon nanotubes are disposed side by side in a direction intersecting with the longitudinal direction of the tape. The tape has a width of about 4 μm, for example. After winding, the super-growth tape is subjected to heat treatment, and thus a cylindrical carbon nanotube block can be formed. The carbon nanotube block is disposed on the semiconductor chip CH in a direction in which the carbon nanotubes intersect with the surface of the semiconductor chip CH, and is exposed from the surface of the sealing resin (see FIG. 23).

The cylindrical carbon nanotube block, which is thus formed of the super-growth tape that is wound and subjected to heat treatment, is used as the heatsink as described in the third embodiment, thereby radiation performance of the semiconductor device can be improved.

A two-dimensional graphite tape may be used in place of the super-growth tape. Specifically, the two-dimensional graphite tape is wound and subjected to heat treatment. In such a case, carbon atoms are also disposed side by side in a direction intersecting with the longitudinal direction of the tape. After winding, the two-dimensional graphite tape is subjected to heat treatment, and thus a cylindrical graphite block can be formed. The graphite block is disposed on the semiconductor chip CH in a direction in which graphite layers intersect with the surface of the semiconductor chip CH, and is exposed from the surface of the sealing resin (see FIG. 23).

The cylindrical graphite block, which is thus formed of the two-dimensional graphite tape that is wound and subjected to heat treatment, is used as the heatsink as described in the third embodiment, thereby radiation performance of the semiconductor device can be improved.

Fifth Embodiment

Figure 35:
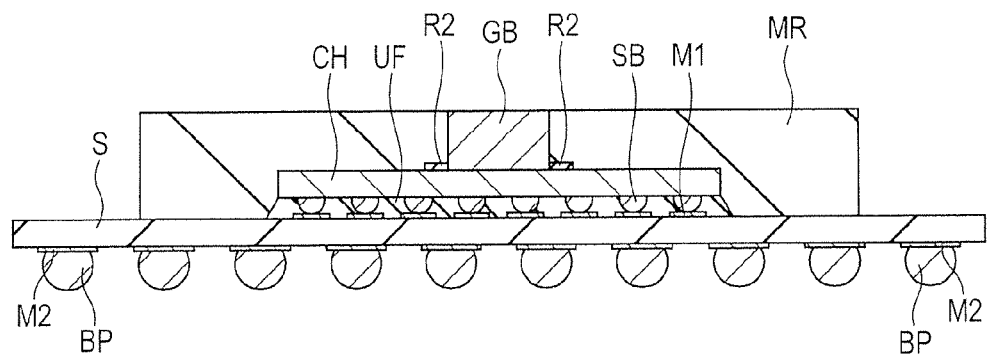
FIG. 35 is a sectional view illustrating a configuration of a semiconductor device of a first application of a fifth embodiment.
Figure 36:
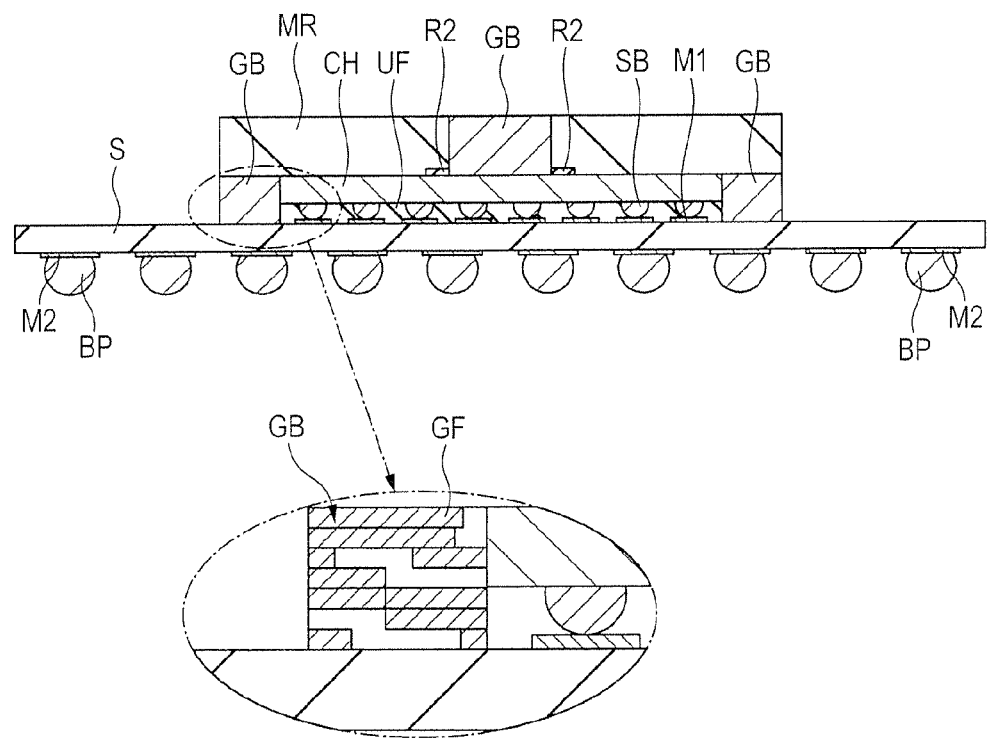
FIG. 36 is a sectional view illustrating a configuration of a semiconductor device of a second application of the fifth embodiment.
Figure 37:
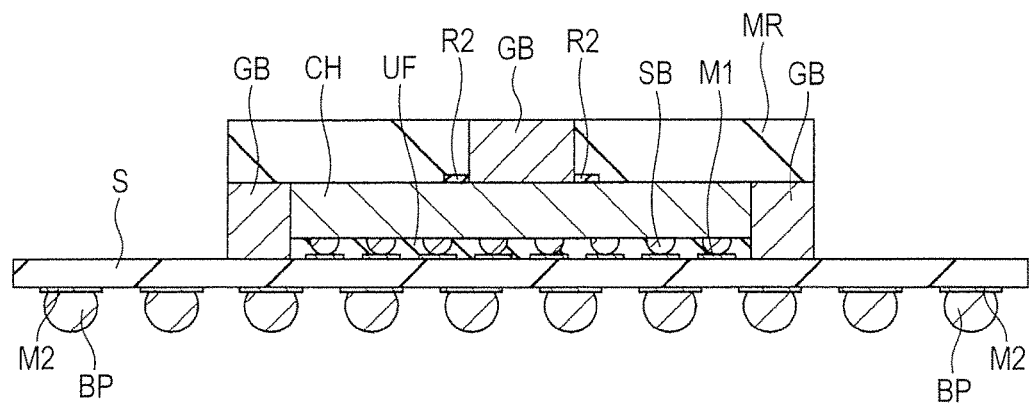
FIG. 37 is a sectional view illustrating a configuration of a semiconductor device of a third application of the fifth embodiment.

In a fifth embodiment, various applications are described. FIGS. 35 to 37 are each a sectional view illustrating a configuration of a semiconductor device of an application of the fifth embodiment. FIG. 35 illustrates a case of a first application, FIG. 36 illustrates a case of a second application, and FIG. 37 illustrates a case of a third application.

First Application

In the first application, the graphene block GB is applied to a type of semiconductor device as described in the second application (FIG. 2) of the second embodiment (FIG. 35). In the first application, the underfill material does not mixedly contain the graphene particles. In the first application, the graphene block GB as a stack of the graphene flakes GF, which are disposed in the direction perpendicular to the surface of the semiconductor chip CH, is used as a heatsink, thereby radiation performance of the semiconductor device can also be improved.

Second Application

Although the graphene block GB is mounted on the semiconductor chip CH in the first application (FIG. 35), the graphene block GB may be disposed so as to be in contact with a side of the semiconductor chip CH as illustrated in FIG. 36. In such a case, a stacked direction of the graphene flakes GF is parallel to the surface of the semiconductor chip CH. In other words, the graphene flakes GF are disposed in a direction perpendicular to the side of the semiconductor chip CH. The surface of the graphene block GB is exposed from the side of the sealing resin MR. The graphene block GB may be fixed (bonded) with an adhesive or an underfill material. In the second application, the graphene block GB, which is formed by stacking the graphene flakes GF disposed in the direction perpendicular to the side of the semiconductor chip CH, is used as the heatsink, thereby radiation performance of the semiconductor device can also be improved.

Third Application

Although the graphene block GB is mounted on the side of the thinned semiconductor chip CH in the second application (FIG. 36), the graphene block GB may be disposed so as to be in contact with a side of a not-thinned semiconductor chip CH as illustrated in FIG. 37. The semiconductor chip CH has a thickness of about 700 μm, for example. In such a case, a stacked direction of the graphene flakes GF is also parallel to the surface of the semiconductor chip CH. The back grinding step (S1) is thus omitted to provide a large side of the semiconductor chip CH, thereby large contact area with the graphene block GB is given, and radiation performance of the semiconductor device can be improved.

Figure 38:
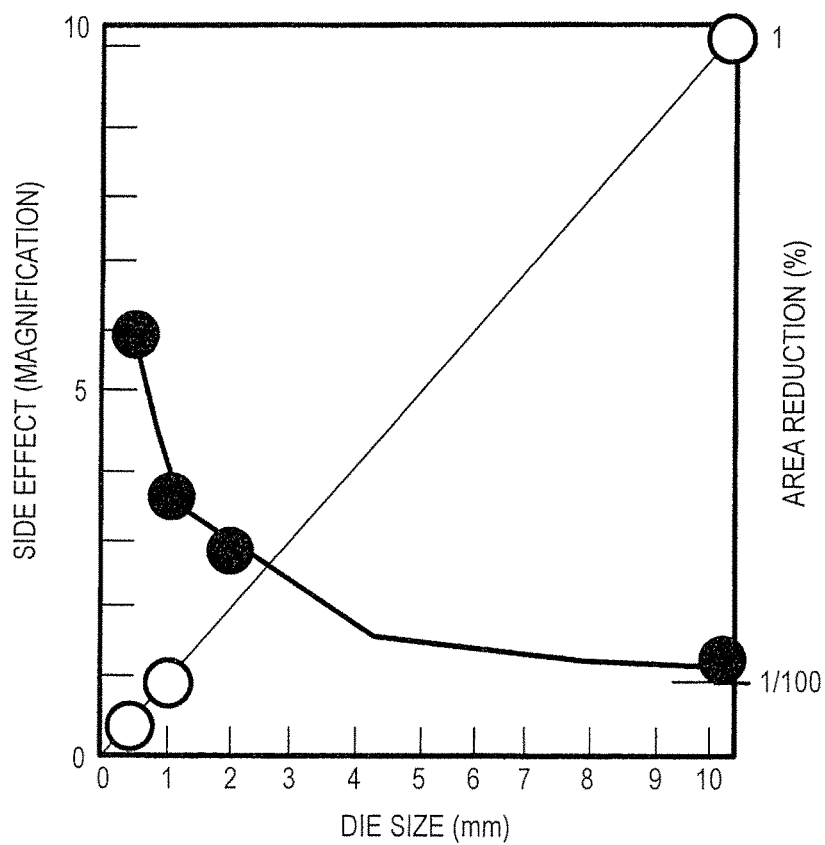
FIG. 38 is a graph showing a relationship between chip area and radiation area.

For example, when radiation from the side of the semiconductor chip CH is used, an increase in area of only about 10% is given for a semiconductor chip of 10 mm square. However, a radiation area 3.5 times larger is given for a semiconductor chip of 1 mm square, and a radiation area 6 times larger is given for a semiconductor chip of 0.5 mm square. In this way, effective radiation can be performed by using the side for a small semiconductor product having a die size of 1 mm or less. FIG. 38 is a graph showing a relationship between chip area and radiation area. The abscissa shows die size (mm), the left ordinate shows side effect (magnification), and the right ordinate shows area reduction (%). As illustrated in FIG. 38, radiation area is reduced with a decrease in die size, and the size effect by the side is larger with smaller die size.

Fourth Application

Although the first to third applications have been exemplarily described with the graphene block GB (see FIG. 33) as described in the third embodiment, the carbon nanotube block GB formed through heat treatment of the super growth tape or the graphite block GB formed through heat treatment of the two-dimensional graphite tape as described in the fourth embodiment may be used. In the graphite block GB, a plurality of graphite layers (graphite materials disposed in a two-dimensional direction) are stacked.

In a possible case, two-dimensional graphite tapes each having a roughly rectangular shape are stacked and subjected to heat treatment to form a heatsink (graphite block GB) having a roughly rectangular solid shape, and the heatsink is fixed to the top or the side of the semiconductor chip CH so as to be in contact therewith. The heatsink having a roughly rectangular solid shape may be appropriately cut into a size corresponding to the side of the semiconductor chip, and used. A super-growth tape may be used in place of the two-dimensional graphite tape.

In another possible case, the two-dimensional graphite tape is wound on a quadrangular prism rod as a core and subjected to heat treatment to forma heatsink (graphite block GB) having a roughly rectangular solid shape, and the heatsink is fixed to the top or the side of the semiconductor chip CH so as to be in contact therewith. The quadrangular prism rod may be left within the heatsink, or may be removed from the heatsink to be used. A super-growth tape may be used in place of the two-dimensional graphite tape.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Supplementary Note

Supplementary Note 1
A semiconductor device includes:
a semiconductor chip; and
a resin material covering the semiconductor chip,
the resin material containing a resin and carbon nanotube particles.
Supplementary Note 2
A semiconductor device includes:
a substrate;
a semiconductor chip coupled onto the substrate via a bump electrode; and
an underfill material disposed between the substrate and the semiconductor chip,
the underfill material containing a resin and carbon nanotube particles.

What is claimed is:

1. A semiconductor device comprising:
a substrate;
a semiconductor chip coupled onto the substrate via a bump electrode; and
an underfill material disposed between the substrate and the semiconductor chip,
wherein the underfill material contains a resin, potassium ions, and graphene particles.

2. The semiconductor device according to claim 1, wherein particle size of the graphene particles is 1 to 100 μm.

3. The semiconductor device according to claim 1, wherein the content of the graphene particles in the underfill material is 30 vol % or less.

* * * * *